(12) United States Patent
Woo et al.

(10) Patent No.: US 11,756,508 B2
(45) Date of Patent: Sep. 12, 2023

(54) ELECTRONIC DEVICE HAVING IMPROVED DISPLAY EFFICIENCY ON SOME AREAS

(71) Applicant: Samsung Display Co., Ltd., Yongin-Si (KR)

(72) Inventors: Minwoo Woo, Seoul (KR); Sungho Kim, Suwon-si (KR); Seokje Seong, Seongnam-si (KR); Jinsung An, Gwacheon-si (KR); Seunghyun Lee, Asan-si (KR); Wangwoo Lee, Osan-si (KR); Hyung Joo Jeon, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/467,818

(22) Filed: Sep. 7, 2021

(65) Prior Publication Data

US 2022/0208147 A1 Jun. 30, 2022

(30) Foreign Application Priority Data

Dec. 29, 2020 (KR) .................. 10-2020-0185568

(51) Int. Cl.
*G09G 5/14* (2006.01)
*G09G 5/12* (2006.01)
*G06F 1/16* (2006.01)
*H04N 23/57* (2023.01)
*H10K 50/84* (2023.01)
(Continued)

(52) U.S. Cl.
CPC ............. *G09G 5/14* (2013.01); *G06F 1/1686* (2013.01); *G09G 5/12* (2013.01); *G09G 2320/0686* (2013.01); *H04N 23/57* (2023.01); *H10K 50/841* (2023.02); *H10K 50/844* (2023.02); *H10K 59/12* (2023.02); *H10K 59/65* (2023.02)

(58) Field of Classification Search
CPC ........ G09G 5/14; G09G 5/12; G09G 2380/02; G09G 2300/023; G09G 2310/0264; G09G 2310/0232; G09G 2320/0686; G06F 1/1686; G06F 1/1626; G06F 1/1652; G06F 1/1658; H01L 27/3234; H04N 5/2257; H04N 5/2252; H04N 5/2254; H04N 23/57
See application file for complete search history.

(56) References Cited

U.S. PATENT DOCUMENTS 10,134,922 B2 11/2018 Min
10,491,726 B2 11/2019 Lee et al.
(Continued)

FOREIGN PATENT DOCUMENTS

KR 101812940 B1 12/2017
KR 1020190083176 A 7/2019
(Continued)

*Primary Examiner* — Xuemei Zheng
(74) *Attorney, Agent, or Firm* — CANTOR COLBURN LLP

(57) ABSTRACT

An electronic device operates in a first mode and a second mode and includes: a display panel including a min part on which an opening area and a display area surrounding the opening area are defined, and a sub-display part disposed below the main part; and an electronic module disposed below the display panel. In the first mode, the sub-display part is disposed below and overlaps the opening area in a plan view, and in the second mode, the electronic module is disposed below and overlaps the opening area in the plan view.

19 Claims, 18 Drawing Sheets

(51) Int. Cl.
*H10K 50/844* (2023.01)
*H10K 59/12* (2023.01)
*H10K 59/65* (2023.01)

(56) References Cited

U.S. PATENT DOCUMENTS

| | | | |
|---|---|---|---|
| 11,079,797 B1* | 8/2021 | Remez | G06F 1/1637 |
| 2018/0095571 A1* | 4/2018 | Park | H01L 27/323 |
| 2020/0154005 A1 | 5/2020 | Han et al. | |
| 2021/0100092 A1* | 4/2021 | Fang | H05K 1/0277 |
| 2021/0135151 A1* | 5/2021 | Baek | H01L 51/5237 |

FOREIGN PATENT DOCUMENTS

| | | | | |
|---|---|---|---|---|
| KR | 102031654 B1 | 10/2019 | | |
| KR | 1020200054033 A | 5/2020 | | |
| WO | WO-2019205630 A1 * | 10/2019 | | G06F 1/1622 |

* cited by examiner

ELECTRONIC DEVICE HAVING IMPROVED DISPLAY EFFICIENCY ON SOME AREAS

This application claims priority to Korean Patent Application No. 10-2020-0185568, filed on Dec. 29, 2020, and all the benefits accruing therefrom under 35 U.S.C. § 119, the content of which in its entirety is herein incorporated by reference.

BACKGROUND

The present disclosure herein relates to an electronic device having improved display efficiency on some areas and improved performance of a sensor, a camera, or the like.

An electronic device may be a device constituted by various electronic components such as a display panel, an electronic module, or the like. The electronic module may include a camera, an infrared sensor, or a proximity sensor. The electronic module may be disposed below the display panel. Transmittance of a partial area of the display panel may be higher than that of each of other partial areas of the display panel. The electronic module may receive an external input through a partial area of the display panel or provide an output through a partial area of the display panel.

SUMMARY

The present disclosure provides an electronic device having improved performance of a sensor, a camera, or the like while increasing in display efficiency on some areas.

The present disclosure also provides an electronic device in which a sensor, a camera, or the like is prevented from being deteriorated in function while a single image is capable of being displayed on an entire surface of a display area.

An electronic device according to an embodiment of the inventive concept operates in a first mode and a second mode. The electronic device includes: a display panel comprising a main part on which an opening area and a display area surrounding the opening area are defined, and a sub-display part disposed below the main part; and an electronic module disposed below the display panel. In the first mode, the sub-display part is disposed below and overlaps the opening area in a plan view, and in the second mode, the electronic module is disposed below and overlaps the opening area in the plan view.

In an embodiment, the electronic module may include a camera module or a sensor module.

In an embodiment, the display panel may further include a connection part extending from one side of the main part and bent so that at least a portion of the connection part has a predetermined curvature, and the sub-display part may extend from the connection part and be disposed opposite to the main part with respect to the connection part.

In an embodiment, the connection part may include: a first bent portion extending from the main part and bent to have a first predetermined curvature; and a non-bent portion extending from the first bent portion and disposed below the main part, wherein the sub-display part may be disposed between the non-bent portion and the main part in a cross-sectional view.

In an embodiment, the electronic module may be disposed between the non-bent portion and the main part in the cross-sectional view.

In an embodiment, the electronic device may further include a driving device which moves the sub-display part and the electronic module.

In an embodiment, when changing from the second mode to the first mode, the driving device may move the sub-display part in a first direction so that the sub-display part is disposed below and overlaps the opening area in the plan view in the first mode, and when changing from the first mode to the second mode, the driving device may move the electronic module in a direction opposite to the first direction so that the electronic module is disposed below and overlaps the opening area in the plan view in the second mode.

In an embodiment, the driving device may include: a first driving part which moves the sub-display part in a vertical direction; and a second driving part which moves the electronic module in one direction crossing the vertical direction and a direction opposite to the one direction. When changing from the second mode to the first mode, the first driving part may move the sub-display part in an upward direction, and the second driving part moves the electronic module in the one direction, and when changing from the first mode to the second mode, the first driving part moves the sub-display part in a downward direction, and the second driving part may move the electronic module in a direction opposite to the one direction.

In an embodiment, the main part may display a first image, and the sub-display part may display a second image synchronized with the first image.

In an embodiment, the display panel may include: a plurality of first pixels disposed on the display area of the main part and which has first luminance; and a plurality of second pixels disposed on the sub-display part and which has second luminance, wherein the second luminance is greater than the first luminance.

In an embodiment, the display panel may further include: a first signal line connected to the first pixels; and a second signal line connected to the second pixels, wherein the first signal line and the second signal line may be electrically connected to each other.

In an embodiment, a panel hole which overlaps the opening area in the plan view may be defined in the main part.

In an embodiment, the electronic device may further include a window disposed on the display panel.

In an embodiment, the display panel may include: a base layer; a circuit layer disposed on the base layer; a light emitting element layer disposed on the circuit layer; an encapsulation layer disposed on the light emitting element layer; and a sensor layer disposed on the encapsulation layer.

In an embodiment, the electronic module may include: a first electronic module and a second electronic module, and the second mode may include: a first sub-mode in which the first electronic module is disposed below and overlaps the opening area in the plan view; and a second sub-mode in which the second electronic module is disposed below and overlaps the opening area in the plan view.

In an embodiment of the inventive concept, an electronic device includes: a display panel on which an opening area and a display area which surrounds the opening area are defined; and an electronic module disposed below the display panel. The display panel include: a main part on which the opening area and the display area are defined; a connection part extending from one side of the main part and bent so that at least a portion of the connection part has a predetermined curvature; and a sub-display part extending from the connection part, disposed opposite to the main part with respect to the connection part, and disposed below the main part.

In an embodiment, the electronic module may be disposed on the connection part.

In an embodiment, the connection part may include: a first bent portion extending from the main part and bent to have a first predetermined curvature; a non-bent portion extending from the first bent portion and disposed below the main part; and a second bent portion extending from the non-bent portion and bent to have a second predetermined curvature, where the sub-display part may extend from the second bent portion.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
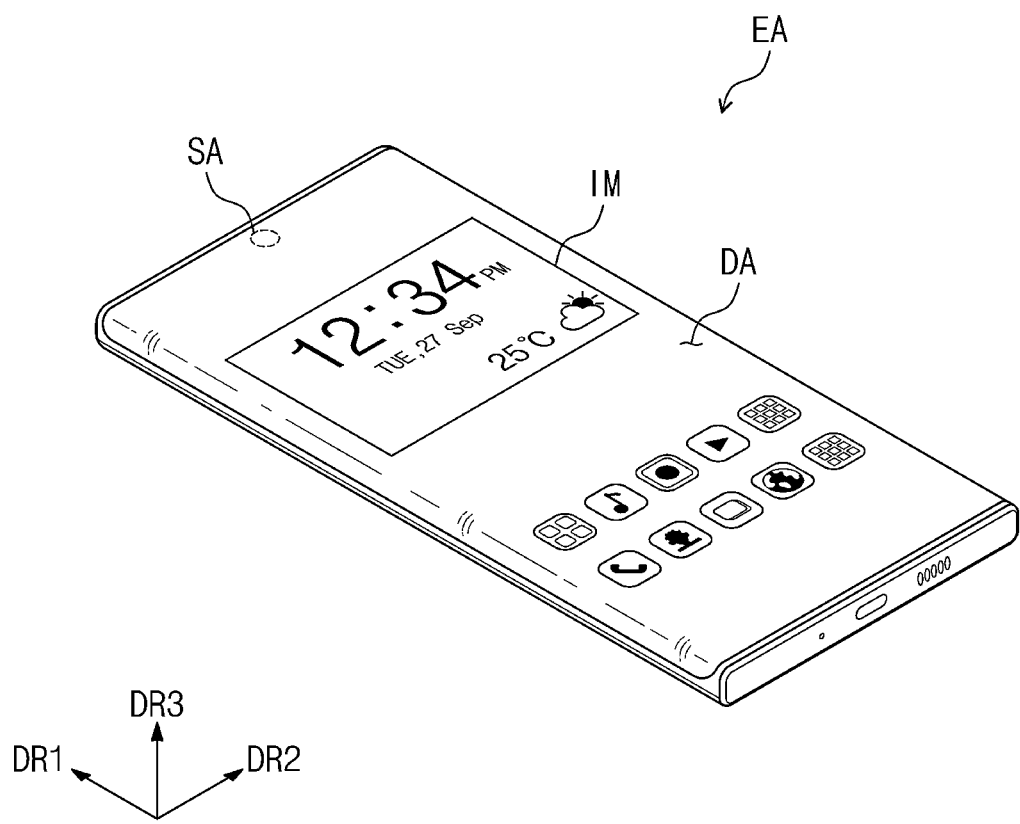
FIG. 1 is a perspective view of an electronic device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", or the like is used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

Figure 2:
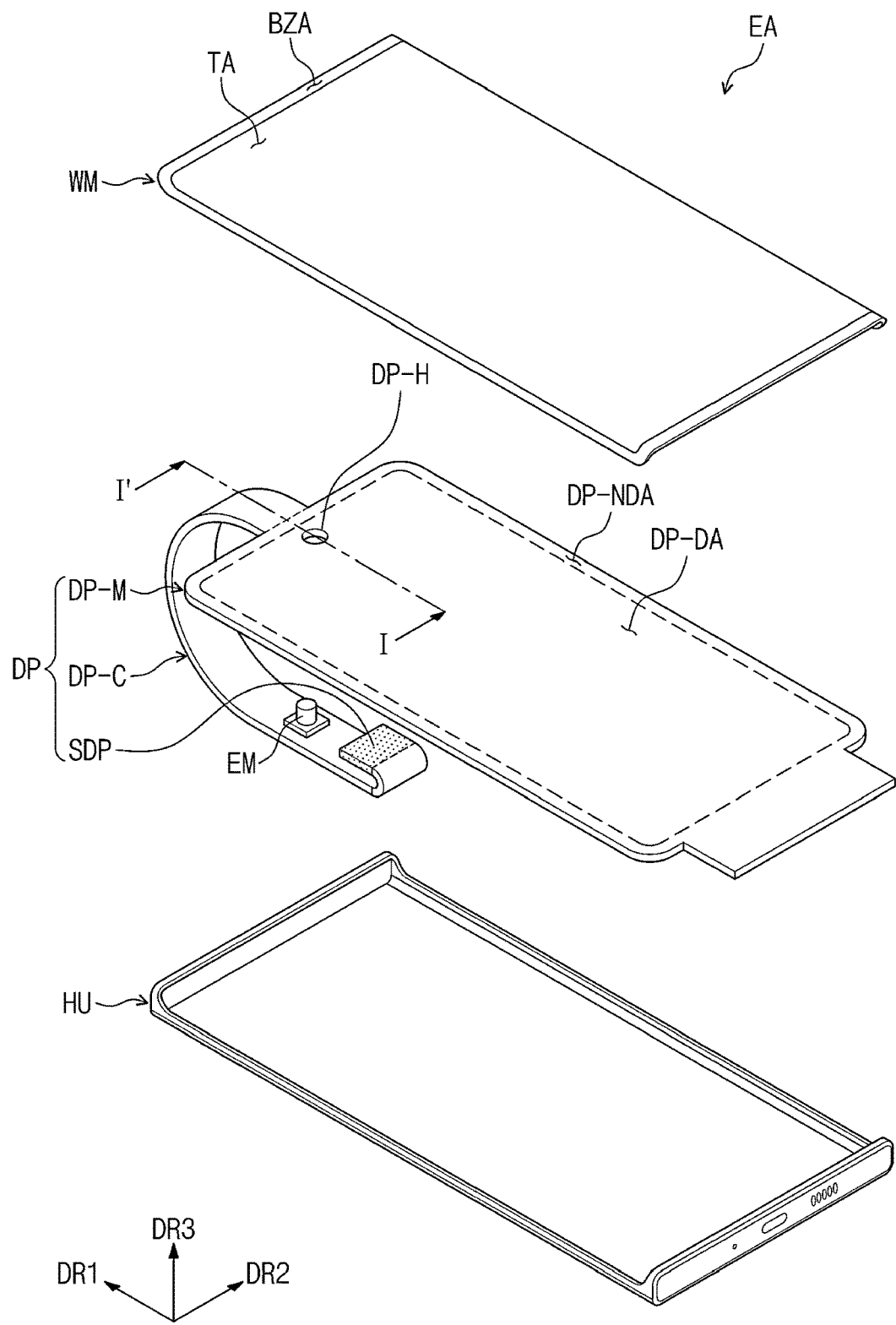
FIG. 2 is an exploded perspective view of the electronic device according to an embodiment of the inventive concept.

FIG. 1 is a perspective view of an electronic device according to an embodiment of the inventive concept. FIG. 2 is an exploded perspective view of the electronic device according to an embodiment of the inventive concept.

Referring to FIGS. 1 and 2, an electronic device EA may be a device that is activated according to an electrical signal. For example, the electronic device EA may be a mobile phone, a tablet PC, a car navigation system, a game console, or a wearable device, but is not limited thereto. FIGS. 1 and 2 illustrate that the electronic device EA is a mobile phone.

The electronic device EA may display an image through a display area DA. The display area DA may include a plane defined by a first direction DR1 and a second direction DR2. The display area DA may further include curved surfaces that are bent from at least two sides of the plane, respectively. However, the shape of the display area DA is not limited thereto. For example, the display area DA may include only the plane. Alternatively, the display area DA may further include at least two curved surfaces, for example, four curved surfaces that are bent from four sides, respectively.

A functional area SA may be defined inside the display area DA of the electronic device EA. Although FIG. 1 illustrates one sensor area as an example of the functional area SA, the number of the functional areas SA is not limited thereto. The functional area SA may be a portion of the display area DA. Thus, the electronic device EA may display an image through the functional area SA.

In one mode of the electronic device EA, an electronic module, for example, a camera module, or a proximity illuminance sensor may be disposed on an area overlapping the functional area SA. The electronic module may receive an external input transmitted through the functional area SA or provide an output through the functional area SA.

In another mode of the electronic device EA, the functional area SA may display an image synchronized with other areas of the display area DA except for the functional area SA. The functional area SA may display the image synchronized with the areas of the display area DA except for the functional area SA, and thus, the entire display area DA may provide a synchronized single image. A detailed description with respect to a mode operation of the electronic device EA will be described later.

A thickness direction of the electronic device EA may be parallel to a third direction DR3 crossing the first direction DR1 and the second direction DR2. Thus, a front surface (or top surface) and a rear surface (or bottom surface) of each of members constituting the electronic device EA may be defined based on the third direction DR3.

Referring to FIG. 2, the electronic device EA according to an embodiment may include a window WM, a display panel DP, and an electronic module EM. The window WM may be disposed on the display panel DP.

The display panel DP according to an embodiment may generate an image to provide the image to a user. The display panel DP according to an embodiment of the inventive concept may be an emission type display panel, but the invention is not limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, or the like. Hereinafter, the display panel DP will be described as the organic light emitting display panel.

The display panel DP may include an active area DP-DA on which an image IM (see FIG. 1) is displayed and a peripheral area DP-NDA adjacent to the active area DP-DA. The display panel DP may include a plurality of pixels on an area corresponding to the active area DP-DA. A driving circuit or a driving line and a signal line providing an electric signal may be disposed on an area corresponding to the peripheral area DP-NDA of the display panel DP.

The display panel DP includes a main part DP-M on which the active area DP-DA and the peripheral area DP-NDA adjacent to the active area DP-DA are defined, and a sub-display part SDP disposed below the main part DP-M. The electronic module EM may be disposed below the main part DP-M.

The display panel DP may further include a connection part DP-C extending from one side of the main part DP-M and partially bent to have a predetermined curvature. The sub-display part SDP may extend from the connection part DP-C and be disposed opposite to the main part DP-M with respect to the connection part DP-C. The sub-display part SDP may extend from an end of the connection part DP-C and may be disposed below the main part DP-M of the display panel DP. The electronic module EM may be disposed above the connection part DP-C. The electronic module EM may be disposed between the connection part DP-C and the main part DP-M in a cross-sectional view.

The window WM may be disposed on the display panel DP. The window WM may protect the display panel DP from an external impact or scratches. The window WM may cover a front surface of the display panel DP.

The window WM may include a top surface exposed to the outside. The top surface of the electronic device EA may be defined by the top surface of the window WM. The top surface of the window WM may include a transmissive area TA and a bezel area BZA adjacent to the transmissive area TA.

The transmission area TA of the window WM may be an optically transparent area. The transmissive area TA may have a shape corresponding to the active area DP-DA of the display panel DP. For example, the transmissive area TA may overlap an entire surface or at least a portion of the active area DP-DA in a plan view. An image displayed on the active area DP-DA of the display panel DP may be visible to the outside through the transmission area TA. A separate hole may not be provided in the transmission area TA of the window WM.

The bezel area BZA of the window WM may be adjacent to the transmissive area TA, and a shape of the transmissive area TA may be defined by the bezel area BZA. For example, the bezel area BZA may surround the transmission area TA. The embodiment according to the invention is not limited thereto, and the bezel area BZA may be disposed adjacent to only one side of the transmission area TA or may be omitted in another embodiment. The bezel area BZA may cover the peripheral area DP-NDA of the display panel DP to prevent the peripheral area DP-NDA from being visible to the outside.

The window WM may include an optically transparent insulating material. For example, the window WM may include a polymer film, a plastic substrate, a thin film glass, or the like. The window WM may have a single layered or multilayered structure. Various functional layers such as an anti-reflection layer, an anti-fingerprint layer, and a phase control layer may be further disposed on the window WM.

In the electronic device EA according to an embodiment, the electronic module EM may be an electronic component that outputs or receives an optical signal. For example, the electronic module EM may be a camera module that photographs an external image or a sensor module such as a proximity sensor or an infrared light emitting sensor.

One of the sub-display part SDP and the electronic module EM may overlap the functional area SA on a plane (i.e., in a plan view). When the electronic device EA operates in one mode, the sub-display part SDP may be disposed to overlap the functional area SA. When the electronic device EA operates in another mode, the electronic module EM may be disposed to overlap the functional area SA in a plan view.

A panel hole DP-H may be defined in the display panel DP to correspond to the functional area SA of the electronic device EA. When the electronic device EA operates in one mode, an image provided from the sub-display part SDP may be provided to the outside through the panel hole DP-H. When the electronic device EA operates in another mode, the function of the electronic module EM (e.g., a camera function or a sensor function) may be performed through the panel hole DP-H in the functional area SA.

Although not shown, the electronic device EA may further include the display panel DP and a circuit board that transmits a control signal for controlling the operation of the electronic module EM. The circuit board may be electrically bonded to one side of the display panel DP. The circuit board may be disposed on a rear surface of the display panel DP as the display panel DP is bent.

The electronic device EA may further include the display panel DP and a housing HU accommodating the electronic module EM. The housing HU may be coupled to the window WM to define an outer appearance of the electronic device EA.

Figure 3A:
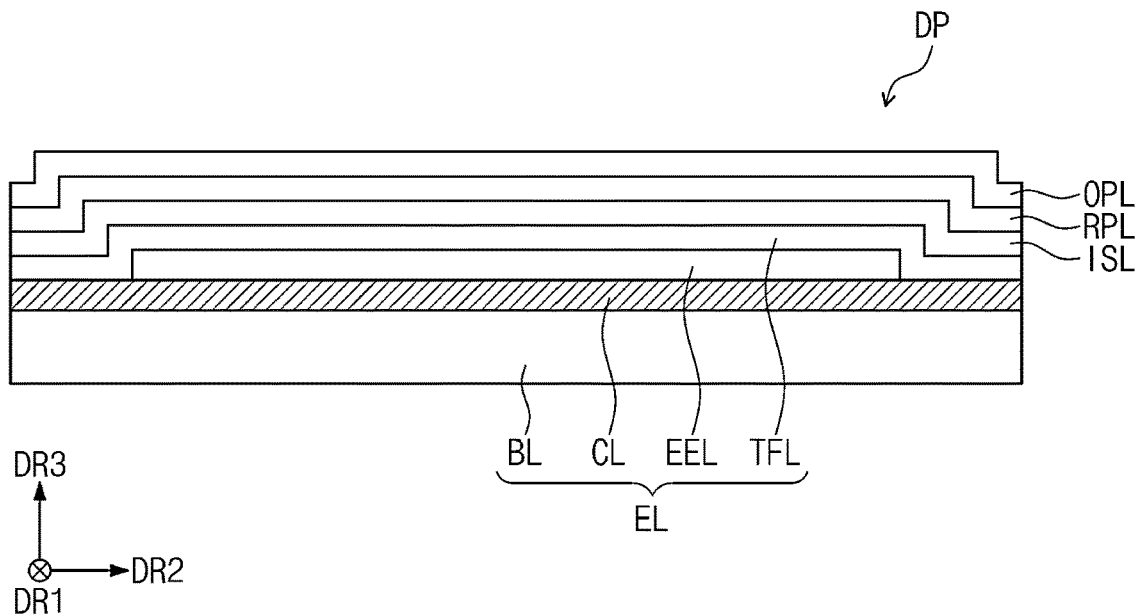
FIGS. 3A to 3C are cross-sectional views of a display panel according to an embodiment of the inventive concept.

FIG. 3A is a cross-sectional view of the display panel according to an embodiment of the inventive concept.

Referring to FIG. 3A, the display panel DP may include a display layer EL, a sensor layer ISL, an anti-reflection layer RPL, and an optical layer OPL.

The display layer EL may be configured to substantially generate an image. The display layer EL may be an emission-type display layer, for example, the display layer EL may be an organic light emitting display layer, a quantum dot display layer, or a micro LED display layer.

The display layer EL may include a base layer BL, a circuit layer CL, a light emitting element layer EEL, and an encapsulation layer TFL.

The base layer BL may be a member that provides a base surface on which the circuit layer CL is disposed. The base layer BL may be a glass substrate, a metal substrate, or a polymer substrate. However, the embodiment of the inventive concept is not limited thereto. For example, the base layer BL may be an inorganic layer, an organic layer, or a composite layer.

The base layer BL may have a multilayered structure. For example, the base layer BL includes a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "A"-based resin means as including a functional group of "A".

The circuit layer CL may be disposed on the base layer BL. The circuit layer CL may include an insulating layer, a semiconductor pattern, a conductive pattern, and a signal line. The insulating layer, the semiconductor layer, and the conductive layer may be formed on the base layer BL in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer CL may be formed.

A light emitting element layer EEL may be disposed on the circuit layer CL. The light emitting element layer EEL may include a light emitting element. For example, the light emitting element layer EEL may include an organic light emitting material, a quantum dot, a quantum rod, or a micro LED.

The encapsulation layer TFL may be disposed on the light emitting element layer EEL. The encapsulation layer TFL may protect the light emitting element layer EEL against foreign substances such as moisture, oxygen, and dust particles.

The sensor layer ISL may be disposed on the display layer EL. The sensor layer ISL may sense an external input applied from the outside. The external input may be a user's input. The user's input may include various types of external inputs such as a portion of user's body, light, heat, a pen, a pressure, or the like.

The sensor layer ISL may be disposed on the display layer EL through a continuous process. In this case, the sensor layer ISL may be expressed as being directly disposed on the display layer EL. The direct disposition may mean that a third component is not disposed between the sensor layer ISL and the display layer EL. That is, a separate adhesive member may not be disposed between the sensor layer ISL and the display layer EL.

Alternatively, the sensor layer ISL and the display layer EL may be coupled to each other through an adhesive member. The adhesive member may include a common adhesive or an adhesive agent. For example, the adhesive member may be a pressure sensitive adhesive. For example, the adhesive member may include an acrylic-based compound or a silicone-based compound. For example, the acrylic-based compound may be butyl acrylate, ethylacrylate, and acrylic acid, or a mixture thereof. However, the material of the adhesive member according to the invention is not limited to the above example.

The anti-reflection layer RPL may be disposed on the sensor layer ISL. The anti-reflection layer RPL may reduce reflectance of external light incident from the outside of the display panel DP. The anti-reflection layer RPL may be formed on the sensor layer ISL through a continuous process. The anti-reflection layer RPL may include color filters. The color filters may have a predetermined arrangement. For example, the color filters may be arranged in consideration of emission colors of pixels provided in the display layer EL. Also, the anti-reflection layer RPL may further include a black matrix adjacent to the color filters.

The optical layer OPL may be disposed on the anti-reflection layer RPL. The optical layer OPL may be formed on the anti-reflection layer RPL through a continuous process. The optical layer OPL may improve front luminance of the display panel DP by controlling a direction of light incident from the display layer EL. For example, the optical layer OPL may include an organic insulating layer in which openings are defined to respectively correspond to emission areas of the pixels provided in the display layer EL and a high refractive index layer that covers the organic insulating layer and is filled in the openings. The high refractive index layer may have a refractive index greater than a refractive index of the organic insulating layer.

The organic insulating layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. The high refractive layer may include a siloxane-based resin. The high refractive index layer may include at least one of zirconium oxide particles, aluminum oxide particles, or titanium oxide particles in addition to the siloxane-based resin.

Light emitted from the pixel may be provided to the optical layer OPL. The light may be reflected from a side surface of the organic insulating layer in which the openings are defined according to a difference in refractive index between the high refractive layer and the organic insulating layer. The light may be reflected from the side surface of the organic insulating layer in which the openings are defined and thus be controlled in traveling direction of the light to improve front luminance of the display panel DP.

In an embodiment of the inventive concept, at least one of the anti-reflection layer RPL or the optical layer OPL may be omitted. Also, an arrangement relationship may be changed differently from that illustrated in FIG. 3A. For example, the optical layer OPL may be provided in the sensor layer ISL, and the anti-reflection layer RPL may also be provided in the sensor layer ISL. In this case, the functions of the anti-reflection layer RPL or the optical layer OPL may be implemented using the insulating layers constituting the sensor layer ISL.

Although not shown, the display panel DP may further include a protective layer disposed below the base layer BL. The protective layer may protect other components of the display panel DP from an external impact. Also, the protective layer may prevent scratches from occurring on rear surfaces of other components of the display panel DP during the process of manufacturing the display panel DP. The protective layer may be a flexible film. As the protective layer is a flexible film, cracks such as cracking or tearing may not occur due to repeated folding and unfolding operations of the electronic device EA. The protective layer may be a film having high light transmittance. The protective layer may include a polyethylene terephtalate ("PET") film.

Figure 3B:
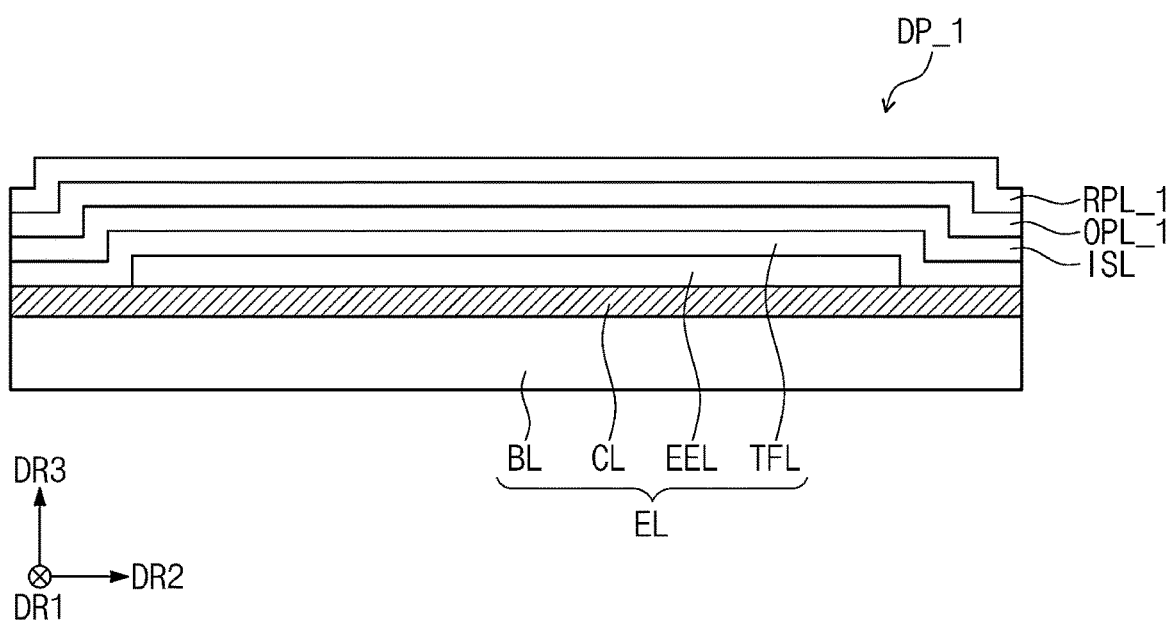

FIG. 3B is a cross-sectional view of a display panel according to an embodiment of the inventive concept.

Referring to FIG. 3B, a display panel DP_1 may include a display layer EL, a sensor layer ISL, an optical layer OPL_1, and an anti-reflection layer RPL_1. The display panel DP_1 illustrated in FIG. 3B has a difference in laminating order of the optical layer OPL_1 and the anti-reflection layer RPL_1 as compared with the display panel DP illustrated in FIG. 3A.

The optical layer OPL_1 may be disposed on the sensor layer ISL. The optical layer OPL_1 may be formed on the sensor layer ISL through a continuous process. The optical layer OPL_1 may control a direction of light incident from the display layer EL to improve front luminance of the display panel DP.

The anti-reflection layer RPL_1 may be disposed on the optical layer OPL_1. The anti-reflection layer RPL_1 may reduce reflectance of external light incident from the outside of the display panel DP_1. The anti-reflection layer RPL_1 may include a polarizing film, and the polarizing film may include a phase retarder and/or a polarizer. Although not shown, the anti-reflection layer RPL_1 may be bonded to the optical layer OPL_1 through an adhesive layer. The adhesive layer may be a transparent adhesive layer such as a pressure sensitive adhesive film ("PSA"), an optically clear adhesive film ("OCA"), or an optically clear resin ("OCR").

In an embodiment of the inventive concept, at least one of the anti-reflection layer RPL_1 or the optical layer OPL_1 may be omitted. Alternatively, the optical layer OPL_1 may be provided in the sensor layer ISL. In this case, a layer implementing a function of the optical layer OPL_1 may be provided using insulating layers constituting the sensor layer ISL.

Figure 3C:
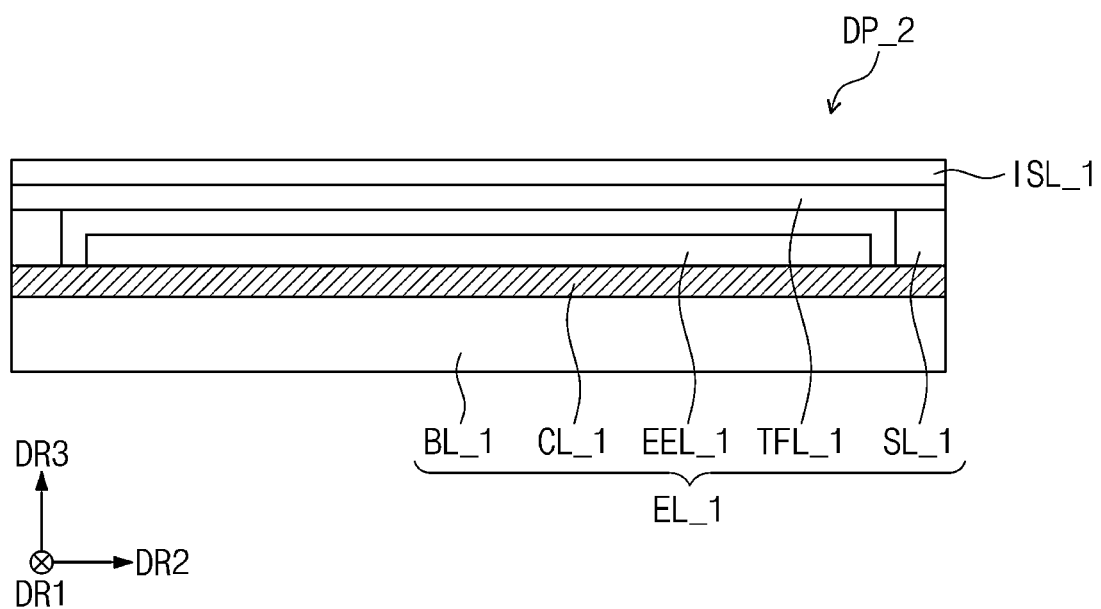

FIG. 3C is a cross-sectional view of a display panel according to an embodiment of the inventive concept.

Referring to FIG. 3C, a display panel DP_2 may include a display layer EL_1 and a sensor layer ISL_1. The display layer EL_1 may include a base substrate BL_1, a circuit layer CL_1, a light emitting element layer EEL_1, an encapsulation substrate TFL_1, and a bonding member SL_1.

Each of the base substrate BL_1 and the encapsulation substrate TFL_1 may be a glass substrate, a metal substrate, or a polymer substrate, but the invention is not particularly limited thereto.

The bonding member SL_1 may be disposed between the base substrate BL_1 and the encapsulation substrate TFL_1. The bonding member SL_1 may bond the encapsulation substrate TFL_1 to the base substrate BL_1 or the circuit layer CL_1. The bonding member SL_1 may include an inorganic material or an organic material. For example, the inorganic material may include a frit seal, and the organic material may include a photocurable resin or a photoplastic resin. However, the material constituting the bonding member SL_1 according to the invention is not limited to the above example.

The sensor layer ISL_1 may be directly disposed on the encapsulation substrate TFL_1. The direct disposition may mean that a third component is not disposed between the sensor layer ISL_1 and the display layer EL_1. That is, a separate adhesive member may not be disposed between the sensor layer ISL_1 and the display layer EL_1. However, the embodiment of the inventive concept is not limited thereto. For example, an adhesive layer may be further disposed between the sensor layer ISL_1 and the encapsulation substrate TFL_1.

Figure 4:
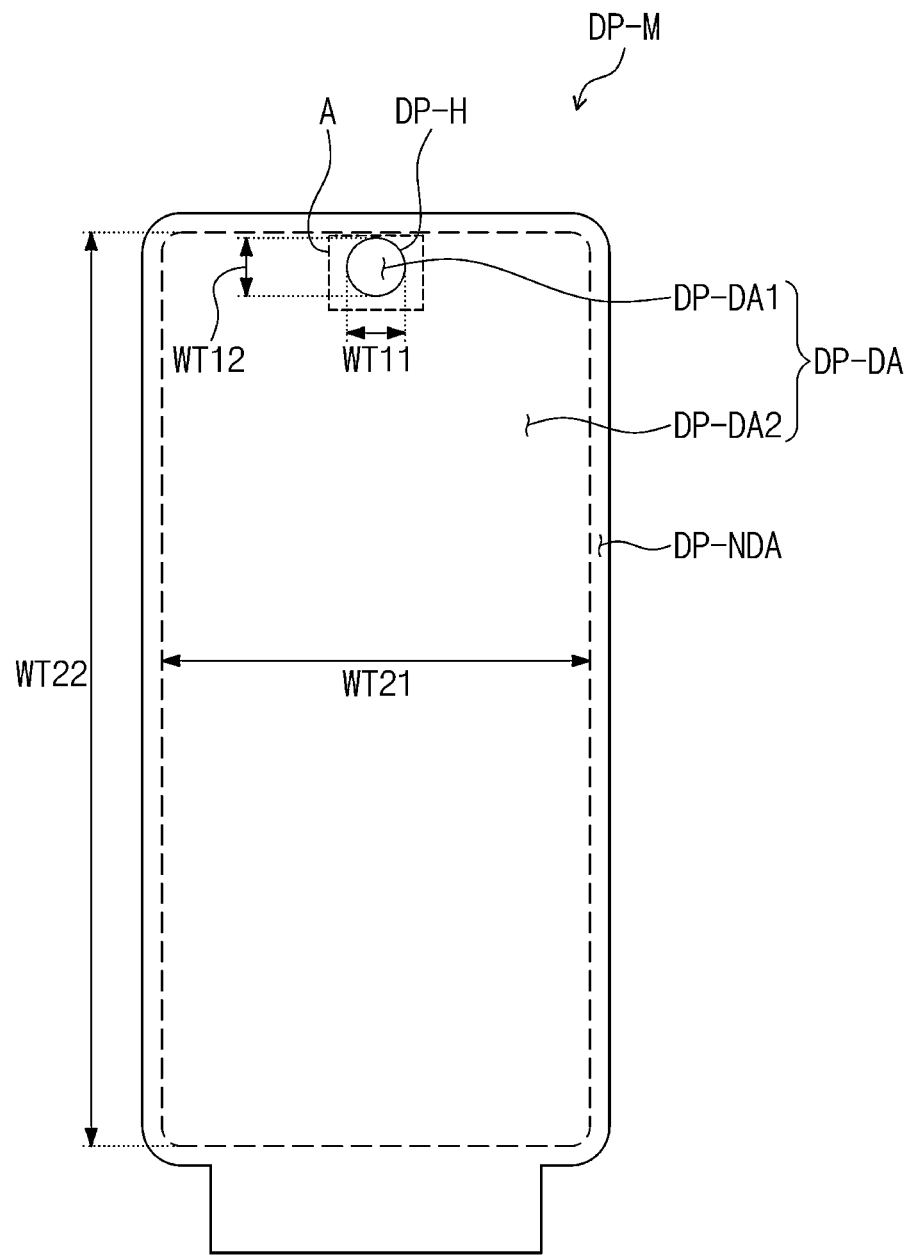
FIG. 4 is a plan view of the display panel according to an embodiment of the inventive concept.

FIG. 4 is a plan view of the display panel according to an embodiment of the inventive concept.

Referring to FIG. 4, the active area DP-DA may include an opening area DP-DA1 and a display area DP-DA2. The electronic module EM may be disposed below the display area DP-DA2. The functional area SA (see FIG. 1) of the electronic device EA (see FIG. 1) may overlap the opening area DP-DA1 in a plan view.

A plurality of pixels may be disposed on the active area DP-DA. Each of the pixels may include a light emitting element and a pixel circuit electrically connected to the light emitting element. The pixels may include first pixels disposed on the display area DP-DA2. In one mode of the electronic device EA, second pixels of a sub-display part SDP (see FIG. 2) disposed to overlap the panel hole DP-H may be disposed on the opening area DP-DA1 in a plan view.

The panel hole DP-H may be defined in the opening area DP-DA1. The panel hole DP-H may correspond to an opening passing from a bottom surface to a top surface of the display panel DP.

A maximum width WT11 of the opening area DP-DA1 in the first direction DR1 may be less than a maximum width WT21 of the display area DP-DA2 in the first direction DR1. Also, a maximum width WT12 of the opening area DP-DA1 in the second direction DR2 may be less than a maximum width WT22 of the display area DP-DA2 in the second direction DR2. The maximum width WT21 of the display area DP-DA2 may be a maximum width of the active area DP-DA in the first direction DR1, and the maximum width WT22 of the display area DP-DA2 may be a maximum width of the active area DP-DA in the second direction DR2.

The opening area DP-DA1 may have a circular shape. The display area DP-DA2 may completely surround the opening area DP-DA'. However, this embodiment of the inventive concept is not limited thereto. For example, the opening area DP-DA1 may have a rectangular shape, and three sides or two sides of the opening area DP-DA1 may be in contact with the display area DP-DA2 according to the position of the opening area DP-DA1 in another embodiment.

Figure 5:
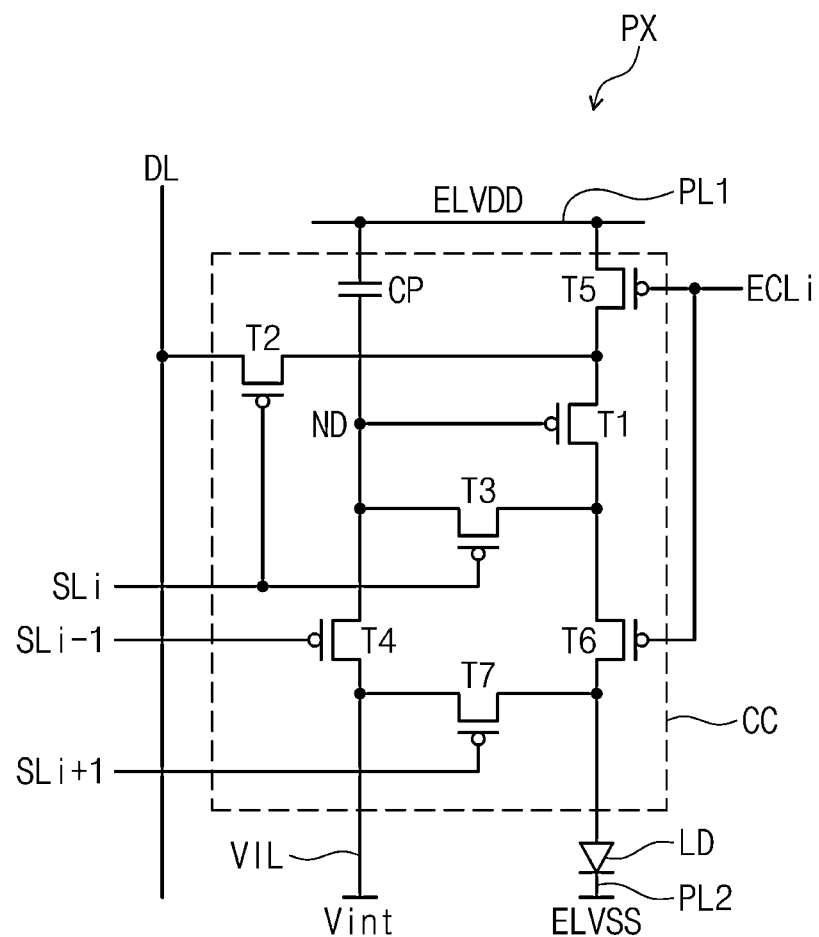
FIG. 5 is an equivalent circuit diagram of a pixel according to an embodiment of the inventive concept.

FIG. 5 is an equivalent circuit diagram of the pixel according to an embodiment of the inventive concept.

Referring to FIG. 5, the pixel PX may include a light emitting element LD and a pixel circuit CC. The light emitting element LD may be provided in the light emitting element layer EEL of FIG. 3A, and the pixel circuit CC may be provided in the circuit layer CL of FIG. 3A.

The pixel circuit CC may include a plurality of transistors T1, T2, T3, T4, T5, T6, and T7, and a capacitor CP. The pixel circuit CC may control an amount of current flowing in the light emitting element LD in response to a data signal. The light emitting element LD may emit light having predetermined luminance corresponding to an amount of current supplied from the pixel circuit CC. For this, the first power ELVDD may be set to a level greater than a level of the second power ELVSS.

The pixel PX may be electrically connected to a plurality of signal lines. In FIG. 5, scan lines SLi, SLi−1, and SLi+1, a data line DL, a first power line PL1, a second power line PL2, an initialization power line VIL, and an emission control line ECLi among the signal lines are illustrated as an example. However, this is merely an example. For example, the pixel PX according to an embodiment of the inventive concept may be additionally connected to various signal lines, and a portion of the illustrated signal lines may be omitted.

Each of the plurality of transistors T1, T2, T3, T4, T5, T6, and T7 may include an input electrode (or a source), an output electrode (or a drain), and a control electrode (or a gate). In this specification, for convenience, either the input electrode or the output electrode may be referred to as a first electrode and the other may be referred to as a second electrode.

The first electrode of the first transistor T1 may be connected to a first power line PL1 via the fifth transistor T5. The first power line PL1 may be a line to which the first power ELVDD is provided. The second electrode of the first transistor T1 is connected to the pixel electrode (or anode) of the light emitting element LD via the sixth transistor T6. The first transistor T1 may be called a driving transistor in this specification.

The first transistor T1 may control an amount of current flowing in the light emitting element LD according to a voltage applied to the control electrode of the first transistor T1.

The second transistor T2 is connected between the data line DL and the first electrode of the first transistor T1. Also, the control electrode of the second transistor T2 is connected to an i-th scan line SLi. When an i-th scan signal is provided to the i-th scan line SLi, the second transistor T2 is turned on to electrically connect the data line DL to the first electrode of the first transistor T1.

The third transistor T3 is connected between the second electrode of the first transistor T1 and the control electrode of the first transistor T1. The control electrode of the third transistor T3 is connected to the i-th scan line SLi. When the i-th scan signal is provided to the i-th scan line SLi, the third transistor T3 is turned on to electrically connect the second electrode of the first transistor T1 to the control electrode of the first transistor T1. Thus, when the third transistor T3 is turned on, the first transistor T1 is connected in the form of a diode.

The fourth transistor T4 is connected between a node ND and the initialization power line VIL. Also, the control electrode of the fourth transistor T4 is connected to an (i−1)-th scan line SLi−1. The node ND may be a node to which the fourth transistor T4 and the control electrode of the first transistor T1 are connected. When the (i−1)-th scan signal is provided to the (i−1)-th scan line SLi−1, the fourth transistor T4 is turned on to provide an initialization voltage Vint to the node ND.

The fifth transistor T5 is connected between the first power line PL1 and the first electrode of the first transistor T1. The sixth transistor T6 is connected between the second electrode of the first transistor T1 and the pixel electrode of the light emitting element LD. The control electrode of the fifth transistor T5 and the control electrode of the sixth transistor T6 are connected to an i-th emission control line ECLi.

The seventh transistor T7 is connected between the initialization power line VIL and the pixel electrode of the light emitting element LD. Also, the control electrode of the seventh transistor T7 is connected to an (i+1)-th scan line SLi+1. When an (i+1)-th scan signal is provided to the (i+1)-th scan line SLi, the seventh transistor T7 is turned on to provide the initialization voltage Vint to the pixel electrode of the light emitting element LD.

The seventh transistor T7 may improve black display capability of the pixel PX. Particularly, when the seventh transistor T7 is turned on, a parasitic capacitor (not shown) of the light emitting element LD is discharged. Thus, when black luminance is implemented, the light emitting element LD does not emit light due to leakage current from the first transistor T1, and thus, the black display performance may be improved.

Although the control electrode of the seventh transistor T7 is connected to the (i+1)-th scan line SLi+1 in FIG. 5B, the embodiment of the inventive concept is not limited thereto. According to another embodiment of the inventive concept, the control electrode of the seventh transistor T7 may be connected to the (i−1)-th scan line SLi−1 or an i-th scan line SLi.

Although a PMOS is illustrated in FIG. 5, the embodiment of the inventive concept is not limited thereto. In another embodiment of the inventive concept, the pixel circuit CC may be constituted by an NMOS. In further another embodiment of the inventive concept, the pixel circuit CC may be constituted by a combination of the NMOS and the PMOS.

The capacitor CP is connected between the first power line PL1 and the node ND. The capacitor CP stores a voltage corresponding to the data signal. When the fifth transistor T5 and the sixth transistor T6 are turned on, an amount of current flowing through the first transistor T1 may be determined according to a voltage stored in the capacitor CP.

The light emitting element LD may be electrically connected to the sixth transistor T6 and the second power line PL2. The light emitting element LD may receive second power ELVSS through the second power line PL2.

The light emitting element LD emits light at a voltage corresponding to a difference between the signal transmitted through the sixth transistor T6 and the second power ELVSS received through the second power line PL2.

The equivalent circuit of the pixel circuit CC is not limited to the example illustrated in FIG. 5. In an embodiment of the present invention, the pixel circuit CC may be modified in various forms to emit light from the light emitting element LD.

Figure 6:
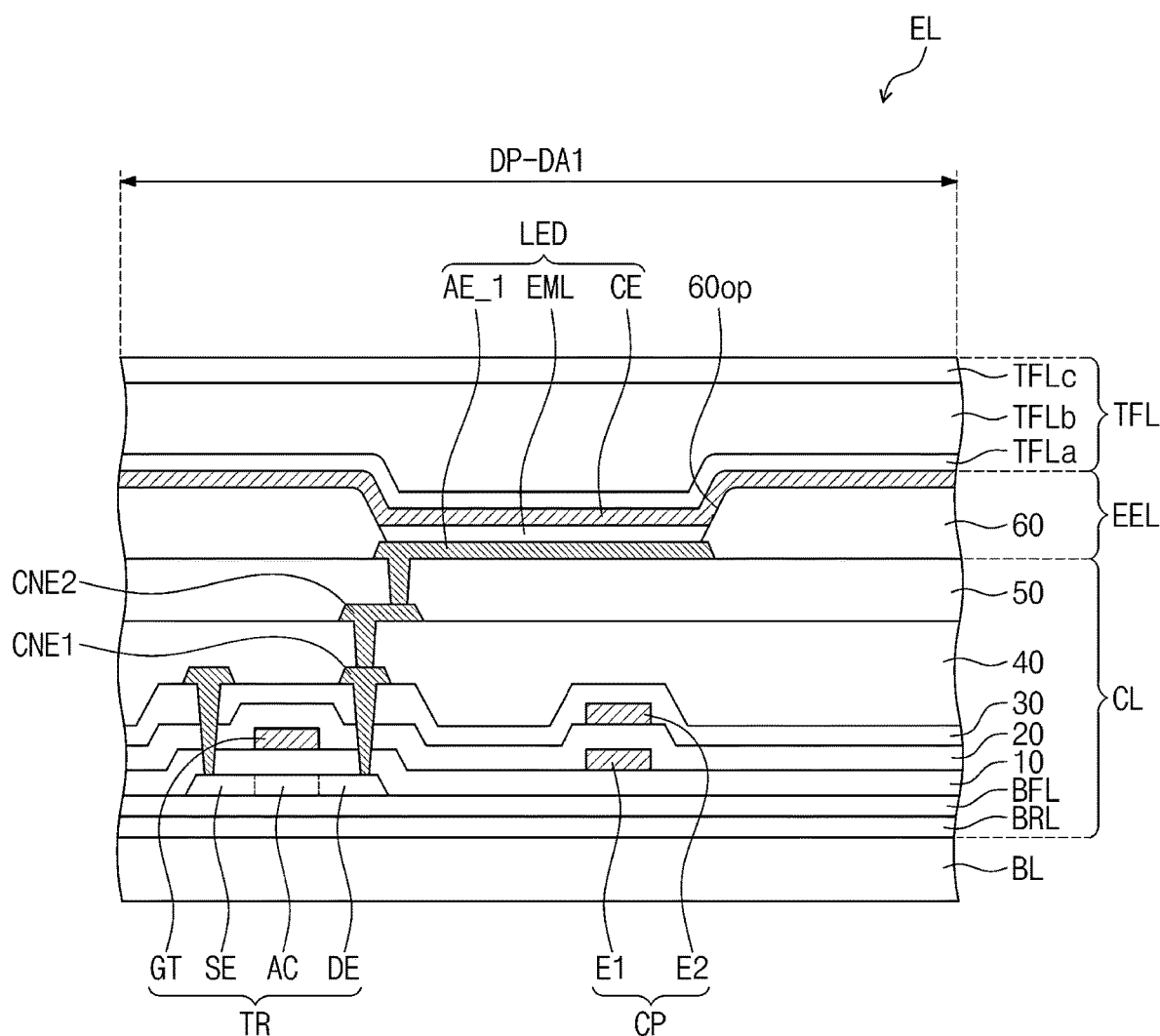
FIG. 6 is a cross-sectional view of a display layer according to an embodiment of the inventive concept.

FIG. 6 is a cross-sectional view of the display layer according to an embodiment of the inventive concept.

Referring to FIG. 6, the display layer EL may include a plurality of insulating layers, a semiconductor pattern, a conductive pattern, a signal line, or the like. The insulating layer, the semiconductor layer, and the conductive layer may be provided in a manner such as coating, deposition, or the like. Thereafter, the insulating layer, the semiconductor layer, and the conductive layer may be selectively patterned in a photolithography manner. In this manner, the semiconductor pattern, the conductive pattern, the signal line, or the like, which are provided in the circuit layer CL and the light emitting element layer EEL may be provided. Thereafter, the encapsulation layer TFL covering the light emitting element layer EEL may be provided.

At least one inorganic layer may be disposed on a top surface of the base layer BL. The inorganic layer may include at least one of aluminum oxide, titanium oxide, silicon oxide, silicon nitride, silicon oxynitride, zirconium oxide, or hafnium oxide. The inorganic layer may be provided as a multilayer. The multilayered inorganic layers may constitute a barrier layer BRL and/or a buffer layer BFL.

The barrier layer BRL may be disposed on the base layer BL. The barrier layer BRL may include at least one of silicon oxide, silicon nitride, or silicon oxynitride. The buffer layer BFL may be disposed on the barrier layer BRL. The buffer layer BFL may improve bonding force between the base layer BL and the semiconductor pattern. The buffer layer BFL may include at least one of a silicon oxide layer, a silicon nitride layer, or a silicon oxynitride layer. For example, the buffer layer BFL may include a structure in which the silicon oxide layer and the silicon nitride layer are alternately laminated.

The semiconductor pattern may be disposed on the buffer layer BFL. The semiconductor pattern may include polysilicon. However, the embodiment of the inventive concept is not limited thereto. For example, the semiconductor pattern may include amorphous silicon or an oxide semiconductor.

FIG. 6 illustrates merely a portion of the semiconductor pattern. For example, the semiconductor pattern may be further disposed on other areas. The semiconductor pattern may be arranged in a specific rule over pixels. The semiconductor pattern has different electrical properties depending on whether the semiconductor pattern is doped. The semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first region.

The first region may have conductivity greater than conductivity of the second region and may substantially serve as an electrode or a signal line. The second region may substantially correspond to an active (or channel) of the transistor. That is to say, a portion of the semiconductor pattern may be an active of the transistor, another portion may be a source or drain of the transistor, and further another portion may be a connection electrode or a connection signal line.

In FIG. 6, one transistor TR and one light emitting element, which are provided in the pixel. are illustrated as an example. FIG. 6 is a cross-sectional view illustrating a portion of the display area DP-DA2.

A source SE, an active AC, and a drain DE of the transistor TR may be formed from the semiconductor pattern. The source SE and the drain DE may extend in opposite directions from the active AC on a cross-section.

A first insulating layer 10 may be disposed on the buffer layer BFL. The first insulating layer 10 commonly overlaps the plurality of pixels PX to cover the semiconductor pattern in a plan view. The first insulating layer 10 may include an inorganic layer and/or an organic layer and have a single-layered or multilayered structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may include a single-layered silicon oxide layer. The insulating layer of the circuit layer CL, which will be described later, as well as the first insulating layer 10 may be an inorganic layer and/or an organic layer and may have a single-layered or a multilayered structure. The inorganic layer may include at least one of the above-described materials, but the invention is not limited thereto.

A gate GT of the transistor TR is disposed on the first insulating layer 10. The gate GT may be a portion of a metal pattern. The gate GT overlaps the active AC in a plan view. In the process of doping the semiconductor pattern, the gate GT may function as a mask.

The second insulating layer 20 may be disposed on the first insulating layer 10 to cover the gate GT. The second insulating layer 20 may be an inorganic layer and/or an organic layer and have a single-layered or multilayered structure. The second insulating layer 20 may include at least one of silicon oxide, silicon nitride, and silicon oxynitride. In this embodiment, the second insulating layer 20 may have a multilayer structure including a silicon oxide layer and a silicon nitride layer.

The capacitor CP may include a first electrode E1 and a second electrode E2 facing the first electrode E1. The first electrode E1 may be disposed on the same layer as the gate GT and may include the same material as the gate GT. For example, the first electrode E1 may be disposed between the first insulating layer 10 and the second insulating layer 20. The second electrode E2 may be disposed on the second insulating layer 20. The location of the capacitor CP is not limited to the example illustrated in FIG. 6. For example, the capacitor CP may be disposed on an additional transistor. That is, the capacitor CP may overlap the additional transistor in a plan view. As a result, a surface area or space in which the pixel circuit or the like is to be formed may be secured.

The third insulating layer 30 may be disposed on the second insulating layer 20, and the third insulating layer 30 may cover the second electrode E2. The third insulating layer 30 may has a single layer or multilayer structure. For example, the third insulating layer 30 may have a multilayer structure including a silicon oxide layer and a silicon nitride layer. A first connection electrode CNE1 may be disposed on the third insulating layer 30. The first connection electrode CNE1 may be connected to the drain DE of the transistor TR through a contact hole passing through the first, second, and third insulating layers 10, 20, and 30.

A fourth insulating layer 40 may be disposed on the third insulating layer 30. The fourth insulating layer 40 may be an organic layer.

A second connection electrode CNE2 may be disposed on the fourth insulating layer 40. The second connection electrode CNE2 may be connected to the first connection electrode CNE1 through a contact hole passing through the fourth insulating layer 40.

A fifth insulating layer 50 may be disposed on the fourth insulating layer 40 to cover the second connection electrode CNE2. The fifth insulating layer 50 may be an organic layer.

The light emitting element layer EEL including the light emitting element LD may be disposed on the circuit layer CL. The light emitting element LD may include a first pixel electrode AE_1, an emission layer EML, and a common electrode CE.

The first pixel electrode AE_1 may be disposed on the fifth insulating layer 50. The first pixel electrode AE_1 may be connected to the second connection electrode CNE2 through a contact hole passing through the fifth insulating layer 50.

A pixel defining layer 60 may be disposed on the fifth insulating layer 50 to cover a portion of the first pixel electrode AE_1. An opening 60op is defined in the pixel defining layer 60. The opening 60op of the pixel defining layer 60 exposes at least a portion of the first pixel electrode AE_1.

The emission layer EML may be disposed on the first pixel electrode AE_1. The emission layer EML may be disposed on an area corresponding to the opening 60op. That is, the emission layer EML may be disposed to be separated from each of the pixels. When the emission layer EML is disposed to be separated from each of the pixels, each of the emission layers EML may emit light having at least one of blue, red, or green color. However, the embodiment of the inventive concept is not limited thereto. For example, the emission layer EML may be commonly provided to be connected to the pixels in another embodiment. In this case, the emission layer EML may provide blue light or white light.

The common electrode CE may be disposed on the emission layer EML. The common electrode CE may have an integrated shape and commonly disposed on the plurality of pixels.

Although not illustrated, a hole control layer may be disposed between the first pixel electrode AE_1 and the emission layer EML. The hole control layer may include a hole transport layer and may further include a hole injection layer. An electron control layer may be disposed between the emission layer EML and the common electrode CE. The electron control layer may include an electron transport layer and may further include an electron injection layer. The hole control layer and the electron control layer may be commonly formed in the plurality of pixels by using an open mask.

The encapsulation layer TFL may be disposed on the light emitting element layer EEL. The encapsulation layer TFL may include an inorganic layer TFLa, an organic layer TFLb, and an inorganic layer TFLc, which are sequentially laminated, but the layers constituting the encapsulation layer TFL according to the invention are not limited thereto.

The inorganic layers TFLa and TFLc may protect the light emitting element layer EEL from moisture and oxygen, and the organic layer TFLb may protect the light emitting element layer EEL from foreign substances such as dust particles. The inorganic layers TFLa and TFLc may include a silicon nitride layer, a silicon oxy nitride layer, a silicon oxide layer, a titanium oxide layer, or an aluminum oxide layer. The organic layer TFLb may include an acrylic-based organic layer, but the invention is not limited thereto.

Figure 7A:
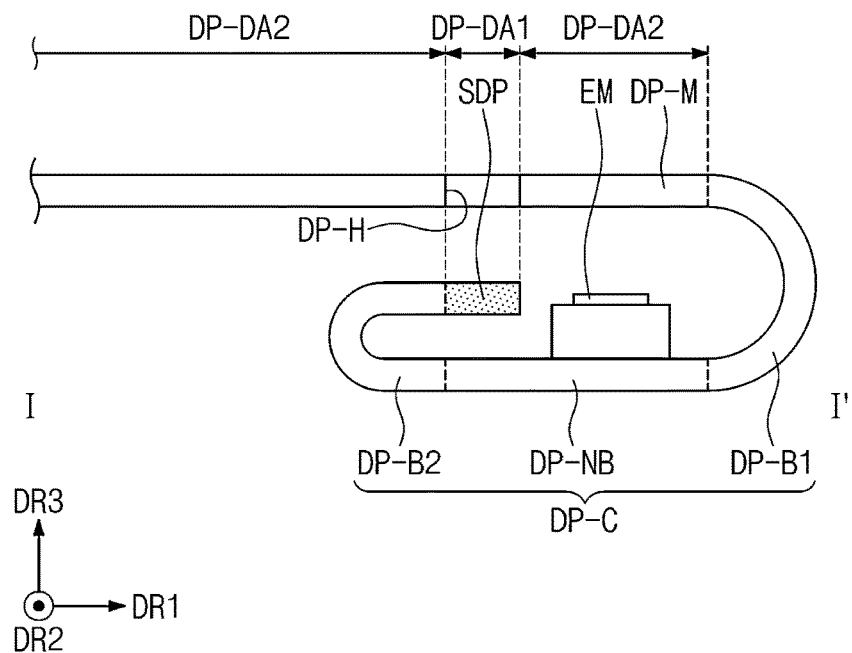
FIGS. 7A and 7B are cross-sectional views illustrating certain modes in which some constituents of the electronic device operate according to an embodiment of the inventive concept.
Figure 7B:
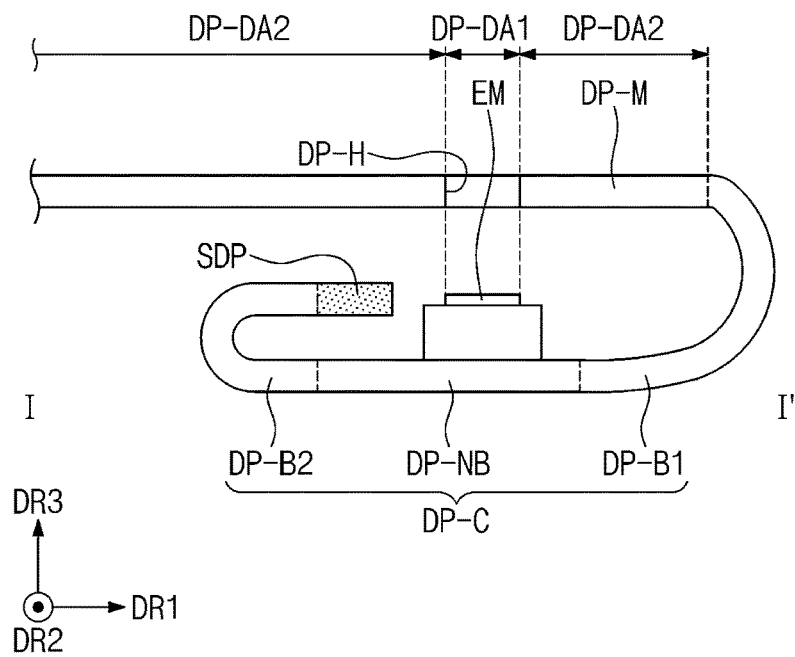

FIGS. 7A and 7B are cross-sectional views illustrating certain modes in which some constituents of the electronic device operate according to an embodiment of the inventive concept. FIGS. 7A and 7B are cross-sectional views taken along line I-I' of FIG. 2. FIG. 7A illustrates a state in which the electronic device operates in a first mode according to an embodiment of the inventive concept. FIG. 7B illustrates a state in which the electronic device operates in a second mode according to an embodiment of the inventive concept. FIGS. 7A and 7B illustrate remaining constituents in a state of omitting the window WM and the housing HU among the constituents illustrated in FIG. 2.

Referring to FIGS. 2, 7A, and 7B, the display panel DP includes a main part DP-M, a connection part DP-C extending from one side of the main part DP-M and bent so that a portion of the connection part DP-C has a predetermined curvature, and a sub-display part SDP extending from the connection part DP-C and opposite to the main part DP-M with respect to the connection part DP-C. The connection part DP-C may include bent portions DP-B1 and DP-B2 bent to have a predetermined curvature and a non-bent portion DP-NB extending from the bent portion DP-B1 and disposed below the main part DP-M. In other words, the connection part DP-C may include a first bent portion DP-B1 extending from the main part DP-M and bent to have a predetermined curvature, a non-bent portion DP-NB extending from the first bent portion DP-B1 and disposed below the main part DP-M, and a second bent portion DP-B2 extending from the non-bent portion DP-NB and bent to have a predetermined curvature. The sub-display part SDP may extend from the second bent portion DP-B2. The electronic module EM may be disposed on the non-bent portion DP-NB. The sub-display part SDP may be disposed between the non-bent portion DP-NB and the main part DP-M.

Referring to FIGS. 2 and 7A together, when the electronic device EA operates in a first mode, the sub-display part SDP may be disposed to overlap the opening area DP-DA1 in a plan view. When the electronic device EA operates in the first mode, the electronic module EM may be disposed to overlap the display area DP-DA2 in a plan view. The sub-display part SDP may display an image synchronized with the display panel DP by passing through the panel hole DP-H. Since the image is displayed in a state in which the sub-display part SDP is disposed to overlap the opening area DP-DA1 in which the panel hole DP-H is defined, the image provided by the sub-display part SDP may be provided to the outside without being deteriorated in luminance.

The main part DP-M and the sub-display part SDP of the display panel DP may provide a synchronized single image. A first image provided from the main part DP-M of the display panel DP may be provided on the display area DP-DA2, and a second image provided from the sub-display part SDP may be provided on the opening area DP-DA1. Here, a single image in which the first image and the second image are synchronized may be provided. That is, the first image and the second image may constitute the single image. A plurality of pixels disposed on the display area DP-DA2 of the main part DP-M and a plurality of pixels disposed on the sub-display part SDP may display the synchronized image. Thus, when viewed from the front by the user (in a plan view), a single image in which the images on the opening area DP-DA1 and the display area DP-DA2 are combined may be displayed.

Referring to FIGS. 2 and 7B, when the electronic device EA operates in a second mode different from the first mode, the electronic module EM may be disposed to overlap the opening area DP-DA1 in a plan view. When the electronic device EA operates in the second mode, the sub-display part SDP may be disposed to overlap the display area DP-DA2 in a plan view. That is, the sub-display part SDP may be disposed below a portion of the main part DP-M rather than the portion in which the panel hole DP-H is defined. The electronic module EM may perform, for example, a camera function or a sensor function by passing through the panel hole DP-H. Since the electronic module EM is disposed so that the panel hole DP-H overlaps the defined opening area DP-DA1 in a plan view to perform, for example, the camera function or the sensor function, the function of the electronic module EM is effectively prevented from being deteriorated.

Although not shown, the electronic device EA may further include a driving device for moving the sub-display part SDP and the electronic module EM. The driving device may be a device that moves the non-bent portion DP-NB on which the electronic module EM is disposed. The driving device may be a device that moves the sub-display part SDP and the electronic module EM by changing a curvature of at least a portion of the bent portions DP-B1 and DP-B2. The driving device may move the sub-display part SDP and the electronic module EM in one direction. In an embodiment, the driving device may move the sub-display part SDP and the electronic module EM in the first direction DR1 and a direction opposite to the first direction DR1 depending on the operation mode (e.g., first mode, second mode). When the electronic device EA operates in the first mode again from the second mode state, the driving device may move the sub-display part SDP and the electronic module EM in the first direction DR1 so that the sub-display part SDP is disposed to overlap the opening area DP-DA1 in a plan view. When the electronic device EA operates in the second mode changing from the first mode state, the driving device may move the sub-display part SDP and the electronic module EM in a direction opposite to the first direction DR1 so that the electronic module EM is disposed to overlap the opening area DP-DA1 in a plan view.

In the electronic device EA according to an embodiment, the electronic module EM and the sub-display part SDP may be disposed below the main part DP-M of the display panel DP in which the panel hole DP-H is defined. The electronic device EA may operate in the first mode, in which the sub-display part SDP is disposed to overlap the panel hole DP-H in a plan view, and the second mode, in which the electronic module EM is disposed to overlap the panel hole DP-H. Particularly, the display panel DP may include the main part DP-M, in which the panel hole DP-H is defined, and the connection part DP-C which extends from one side of the main part DP-M and of which a portion is bent to be disposed below the main part DP-M. Since the sub-display part SDP extending from the connection part DP-C and the electronic module EM disposed above the connection part DP-C are moved, the display panel DP may operate in the first mode and the second mode. Thus, in the first mode, the electronic device EA according to an embodiment may display a synchronized single image without being deteriorated in luminance through the main part DP-M and the sub-display part SDP of the display panel DP. In the second mode, the camera function or the sensor function, for example, may be performed without being deteriorated in function of the electronic module EM.

Figure 9A:
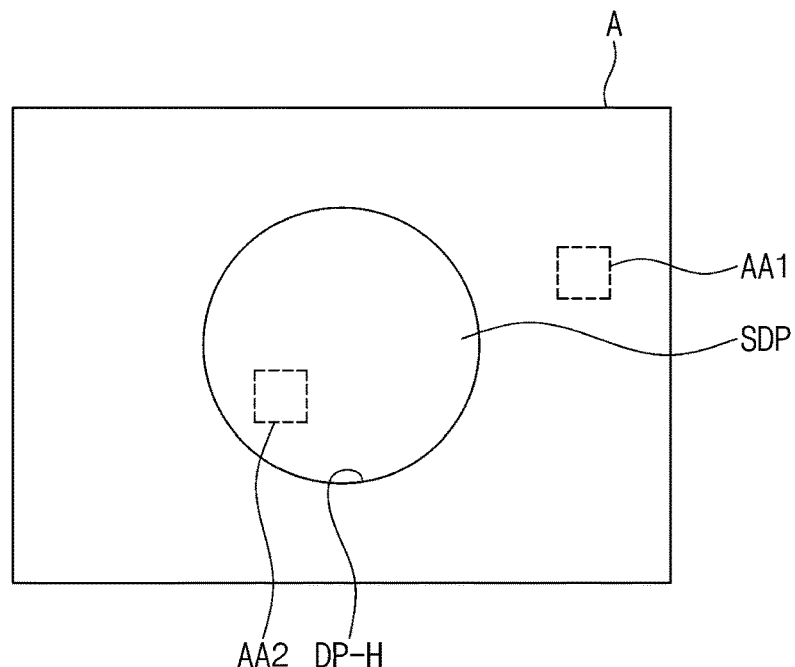
FIGS. 9A to 9C are plan views illustrating certain modes in which some constituents of the electronic device operate according to an embodiment of the inventive concept.
Figure 9B:
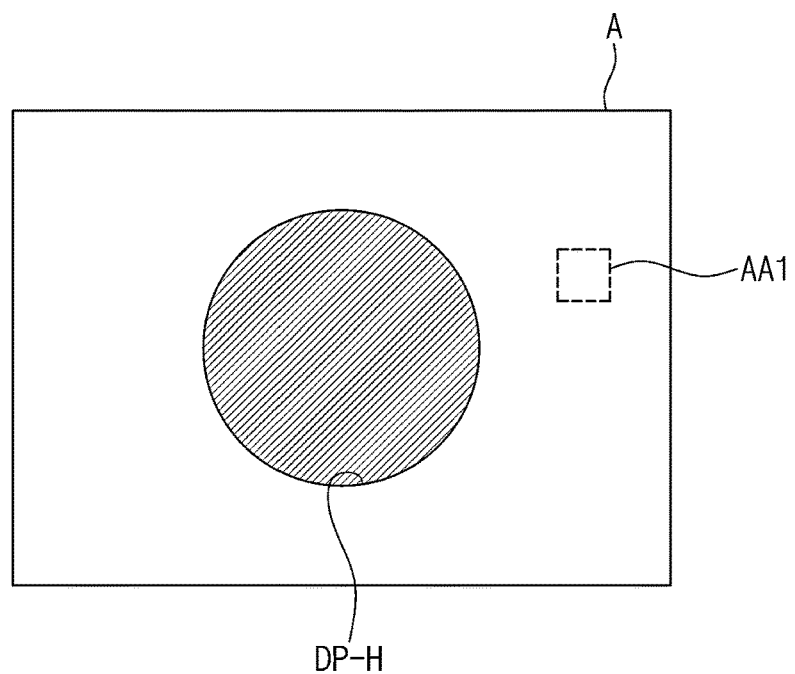
Figure 9C:
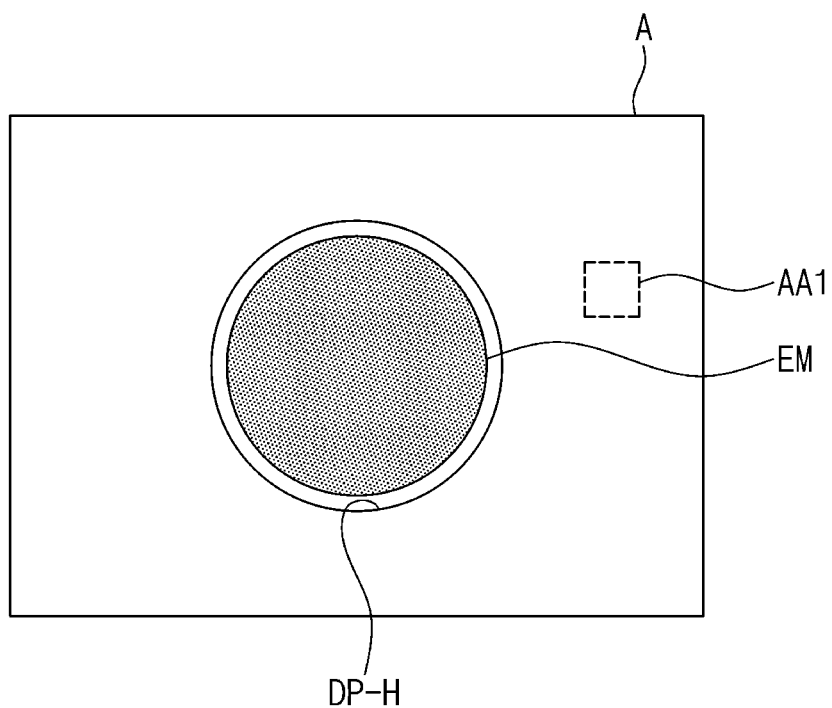
Figure 10A:
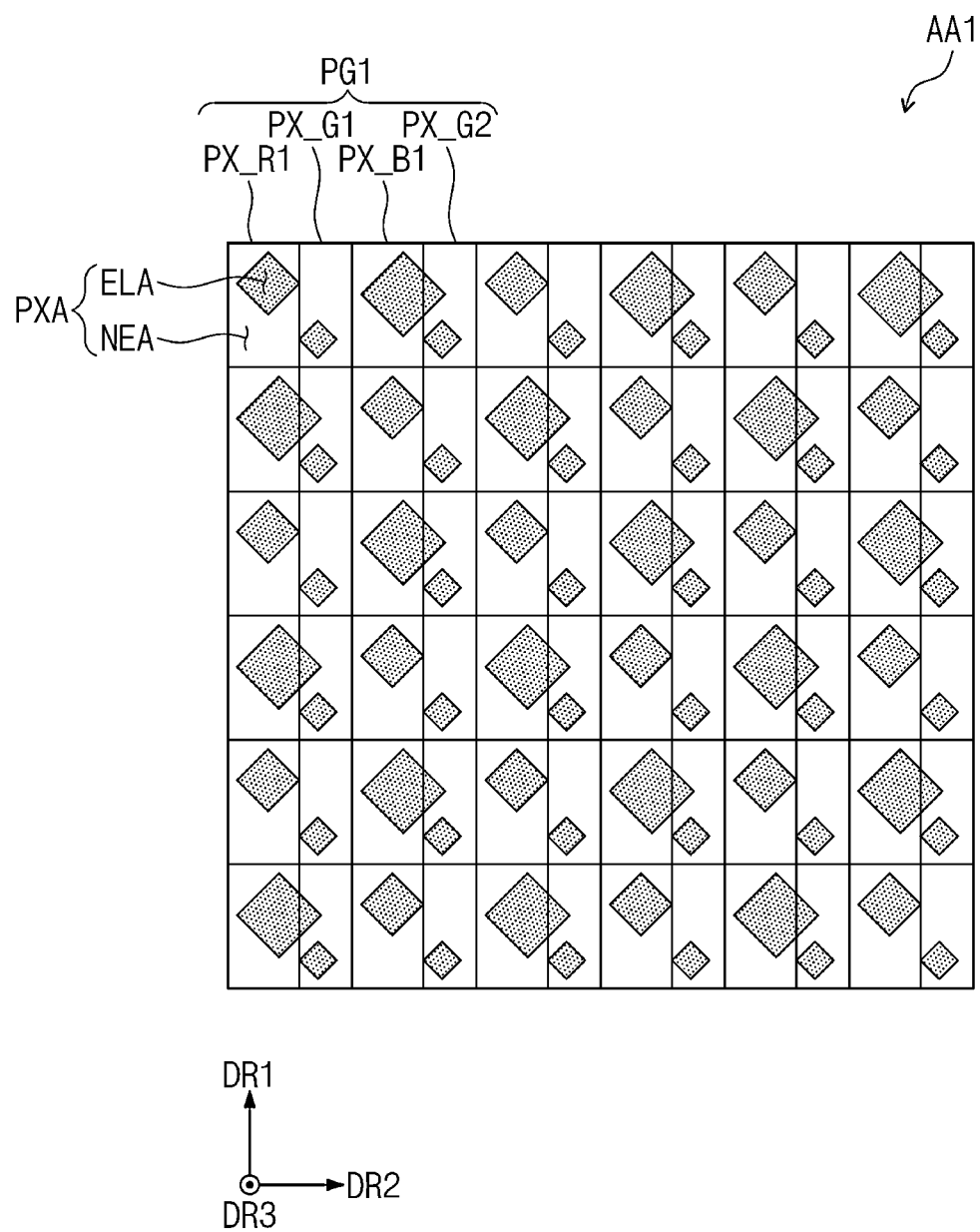
FIGS. 10A and 10B are plan views illustrating a partial area of the display panel according to an embodiment of the inventive concept.
Figure 10B:
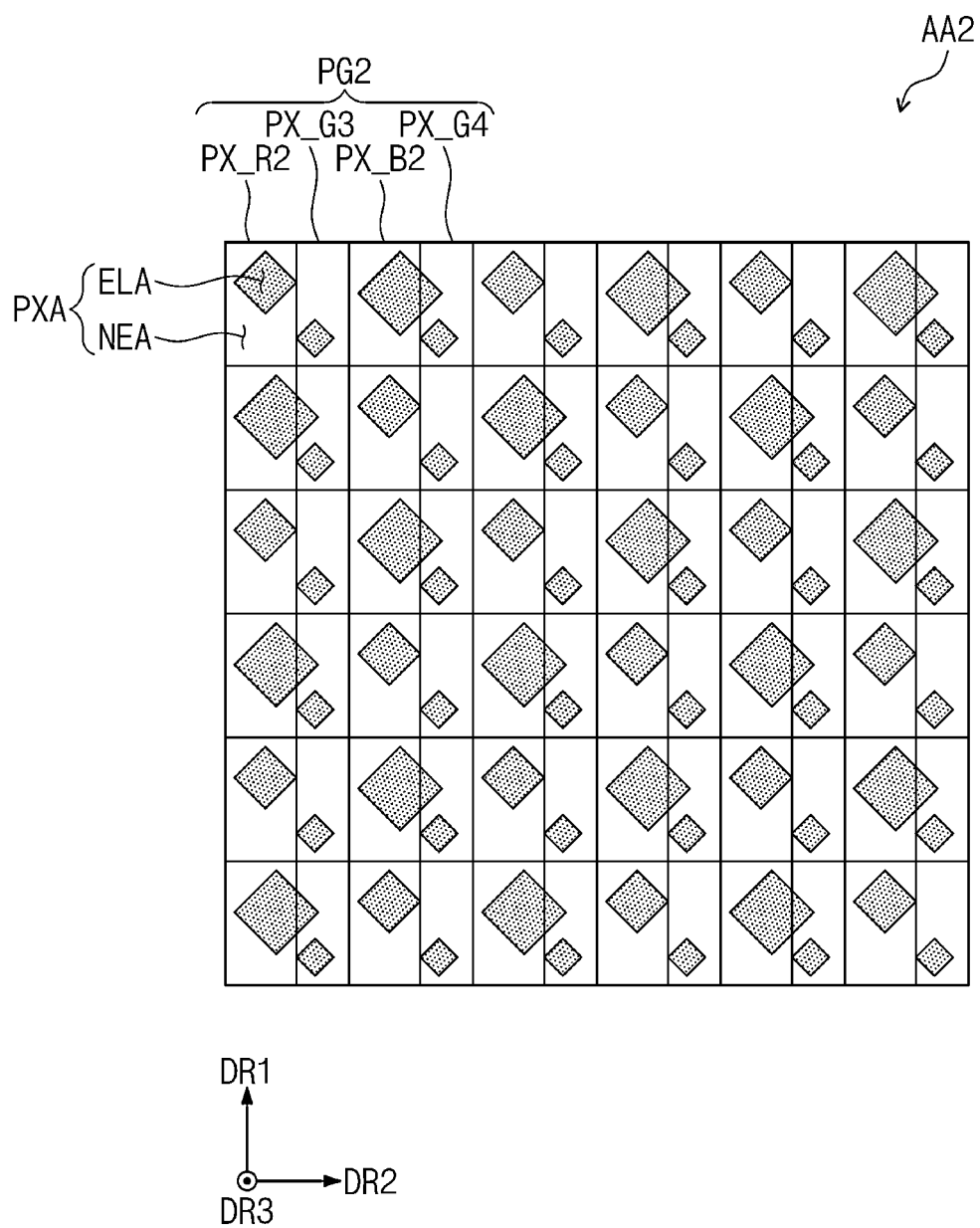

FIGS. 8A to 8E are cross-sectional views illustrating certain modes in which some constituents of an electronic device operate according to another embodiment of the inventive concept. FIGS. 9A to 9C are plan views illustrating certain modes in which some constituents of the electronic device operate according to an embodiment of the inventive concept. FIGS. 10A and 10B are plan views illustrating a partial area of the display panel according to an embodiment of the inventive concept. FIGS. 8A to 8E are cross-sectional views taken along line I-I' of FIG. 2. FIGS. 9A to 9C are plan views of a plane corresponding to an area A of FIG. 4. FIG. 10A is a plan view of a plane corresponding to an area AA1 of FIG. 9A. FIG. 10A is a plan view of a plane corresponding to an area AA2 of FIG. 9A.

Figure 8A:
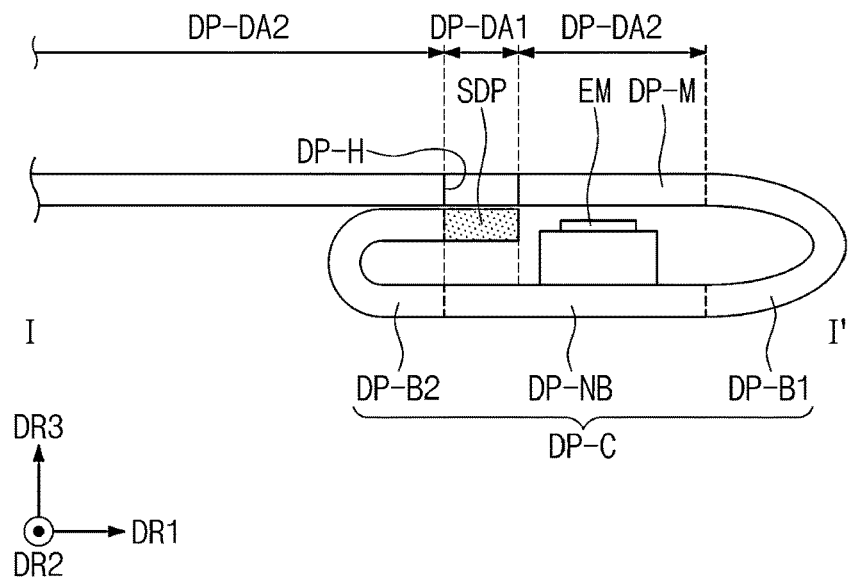
FIGS. 8A to 8E are cross-sectional views illustrating certain modes in which some constituents of an electronic device operate according to another embodiment of the inventive concept.
Figure 8B:
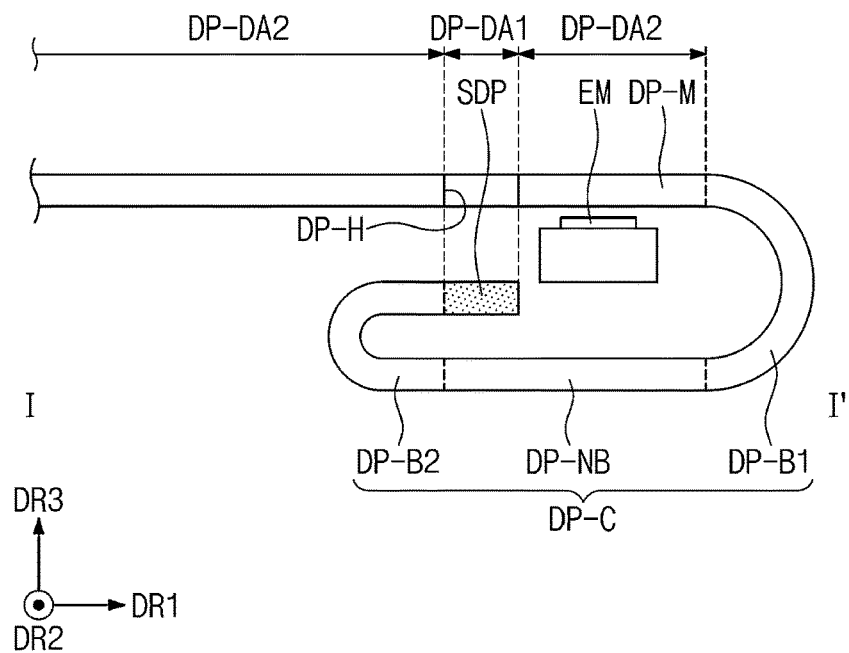
Figure 8C:
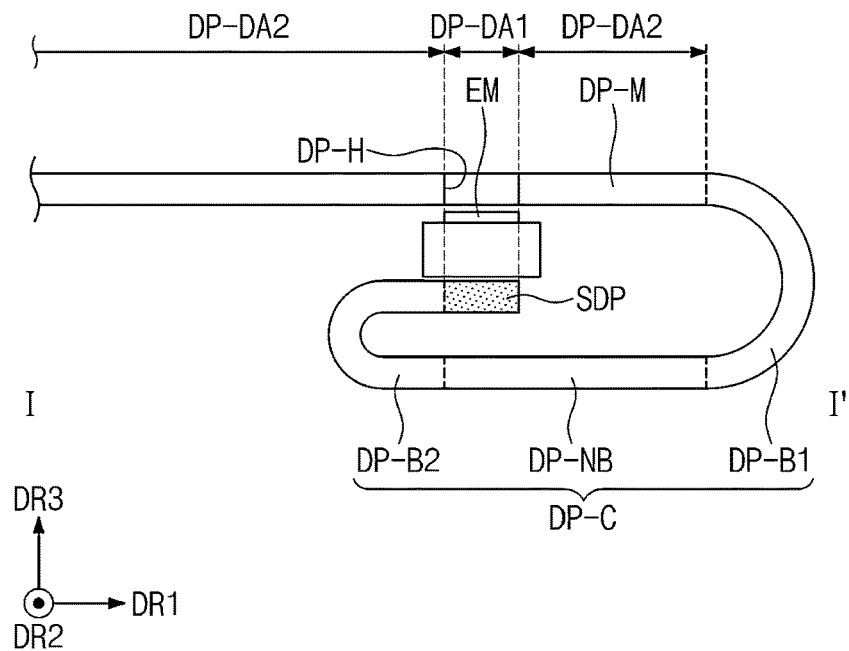
Figure 8D:
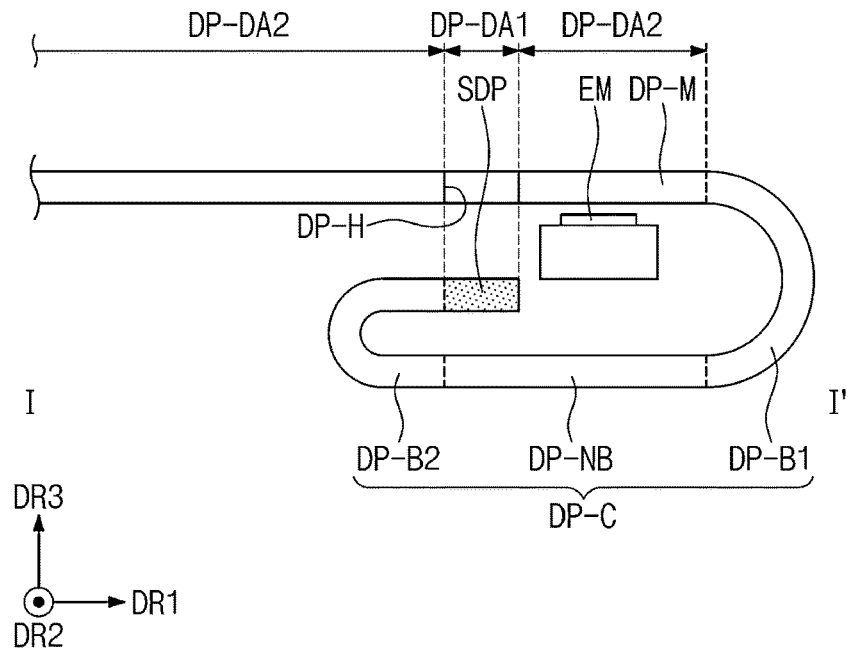
Figure 8E:
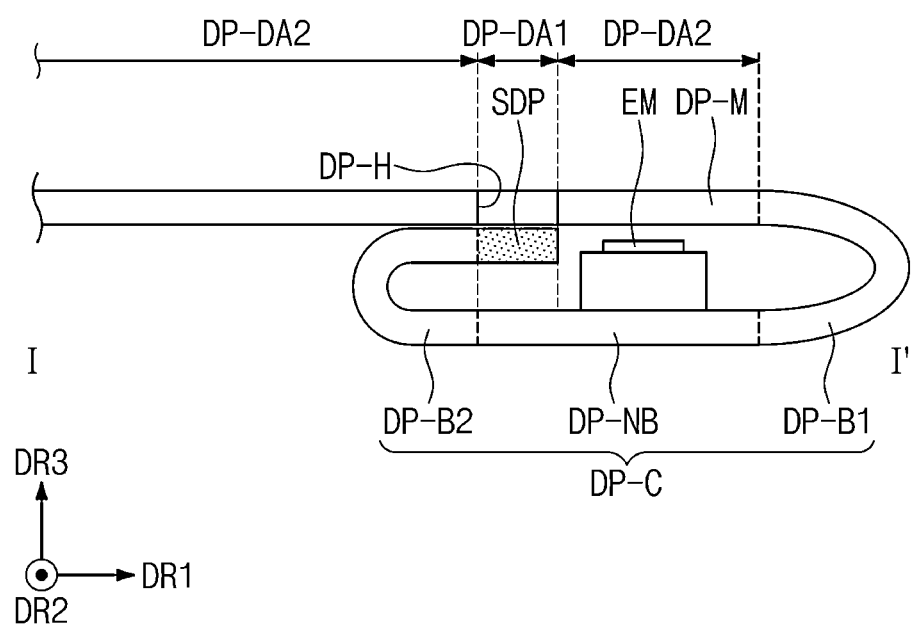

FIG. 8A is a cross-sectional view when the electronic device operates in the first mode according to an embodiment of the inventive concept. FIG. 8B is a cross-sectional view when the electronic device operates in an intermediate process in which the first mode is changed to the second mode according to an embodiment of the inventive concept. FIG. 8C is a cross-sectional view when the display device operates in the second mode according to an embodiment of the inventive concept. FIG. 8D is a cross-sectional view when the electronic device operates in an intermediate process in which the second mode is changed to the first mode according to an embodiment of the inventive concept. FIG. 8E is a cross-sectional view when the display device operates in the first mode according to an embodiment of the inventive concept. FIG. 9A is a plan view when the display device operates in the first mode according to an embodiment of the inventive concept. FIG. 9B is a plan view when the electronic device operates in the intermediate process in which the first mode is changed to the second mode according to an embodiment of the inventive concept. FIG. 9C is a plan view when the display device operates in the second mode according to an embodiment of the inventive concept.

Hereinafter, in describing the operation of the electronic device according to an embodiment of the present invention with reference to FIGS. 8A to 8E, 9A to 9C, and FIGS. 10A and 10B, detailed description with respect to the same contents as those described in FIGS. 7A and 7B will be omitted.

Referring to FIGS. 2, 8A, 8B, 9A, and 9B, when the electronic device EA according to an embodiment operates in the first mode, the sub-display part SDP may be disposed to overlap the opening area DP-DA1 in which the panel hole DP-H is defined. Thereafter, when the electronic device EA is changed from the first mode to the second mode, the sub-display part SDP may be preferentially moved downward, that is, in a direction opposite to the third direction DR3.

The sub-display part SDP may have a planar area equal to or greater than planar area of the defined area of the panel hole DP-H. Thus, in the first mode, in the opening area DP-DA1 in which the panel hole DP-H is defined, an image may be provided by the sub-display part SDP, and thus, the panel hole DP-H may not be visible from the outside. Thereafter, as the sub-display part SDP is moved downward, image luminance provided through the panel hole DP-H may decreases as illustrated in FIG. 9B, and thus, the panel hole DP-H may be temporarily visible from the outside.

Referring to FIGS. 2, 8B, 8C, 9B, and 9C together, after the sub-display part SDP is moved downward, since the electronic module EM is moved in the opposite direction to the first direction DR1 so as to be disposed to overlap the opening area DP-DA1 in a plan view, the electronic device EA may operate in the second mode. In an embodiment, even if the electronic device EA is changed from the first mode to the second mode, the sub-display part SDP may overlap the opening area DP-DA1. However, in the second mode, since the electronic module EM is disposed on the sub-display part SDP, the image generated by the sub-display part SDP may not be visible from the outside, and the function of the electronic module EM may be performed. The electronic module EM may have a planar area that is equal to or less than the planar area of the area in which the panel hole DP-H is defined. Accordingly, since the electronic module EM may be disposed so that the electronic module EM entirely overlaps inside of the panel hole DP-H in a plan view, the function of the electronic module EM may be effectively prevented from being deteriorated.

Referring to FIGS. 2, 8C, and 8D together, when the electronic device EA is changed from the first mode to the second mode, the electronic module EM may be moved first in the first direction DR1 and then be disposed below the display area DP-DA2 without allowing the electronic module EM to overlap the opening area DP-DA1 in a plan view.

Referring to FIGS. 2, 8D and 8E together, after the electronic module EM is moved in the first direction DR1, the sub-display part SDP may be moved upward, that is, in the third direction DR3, and thus, the electronic device EA may operate in the first mode.

Although not shown, the electronic device EA may further include a driving device for moving the sub-display part SDP and the electronic module EM. The driving device may include a first driving part for moving the sub-display part SDP and a second driving part for moving the electronic module EM. The first driving part may move the sub-display part SDP in a vertical direction, that is, in the direction opposite to the third direction DR3. The second driving part may move the electronic module EM in the first direction DR1 and the opposite direction of the first direction DR1.

When the electronic device EA operates in the first mode again from the second mode state, the first driving part may move the sub-display part SDP upward in the third direction DR3, and the second driving part may move the electronic module EM in the first direction DR1. When the electronic device EA operates in the second mode again from the first mode state, the first driving part may move the sub-display part SDP downward in a direction opposite to the third direction DR3, and the second driving part may move the electronic module EM in a direction opposite to the first direction DR1.

In the electronic device EA according to an embodiment, when the sub-display part SDP for the mode change is moved, since the sub-display part SDP is moved in the third direction DR3 and the opposite direction of the third direction DR3, the sub-display part SDP may overlap the opening area DP-DA1 in each of the first and second modes in a plan view. That is, in all the modes according to the operation of the electronic device EA, the sub-display part SDP may be maintained in state of overlapping the opening area DP-DA1. Thus, since the sub-display part SDP is not deviated from the portion in which the panel hole DP-H is defined, a defect in which the pixels are misaligned may be prevented.

Referring to FIGS. 9A and 10A, a plurality of first pixels may be disposed on the display area DP-DA2. The first pixels may be disposed to be spaced apart from each other in the first direction DR1 and the second direction DR2.

The first pixels may include a plurality of red pixels PX_R1, a plurality of green pixels PX_G1 and PX_G2, and a plurality of blue pixels PX_B1. The first pixels may be grouped into a plurality of first pixel groups PG1. For example, the first pixel group PG1 may include one first red pixel PX_R1, two first green pixels PX_G1 and PX_G2, and one first blue pixel PX_B1. Each of the first pixels of the first pixel group PG1 may include an emission area ELA and a non-emission area NEA. According to an embodiment of the inventive concept, the light emitting area ELA may have a rectangular shape, but the invention is not limited thereto. A first light emitting element may be disposed on the emission area ELA, and transistors for driving the first light emitting element may be disposed on the non-emission area NEA.

The plurality of first pixel groups PG1 may be disposed on a first area AA1 of the display area DP-DA2. The first area AA1 may mean a unit area.

In the first area AA1, the first pixel groups PG1 may be disposed in a matrix shape. For example, the plurality of first pixel groups PG1 may be disposed to be spaced apart from each other in the first direction DR1 and the second direction DR2.

Although a structure in which 18 first pixel groups PG1 are disposed on the first area AA1 is illustrated, this is merely an example for convenience of description and thus is the invention not limited thereto. The number of first pixel groups PG1 disposed on the first area AA1 may increase.

For convenience of explanation, the shape of each of the first pixels PX1 has a square shape, but this is merely an example, and thus, each of the first pixels PX1 may have various shapes. For example, each of the first pixels PX1 may include a light emitting element and a transistor. An area on which the light emitting element and the transistor are disposed is not limited to the square area.

Referring to FIGS. 9A and 10B, a plurality of second pixels may be disposed on the opening area DP-DA1.

Each of the second pixels may have the same structure as each of the first pixels. The second pixels may be grouped into a plurality of second pixel groups PG2. For example, the second pixel group PG2 may include one second red pixel PX_R2, two second green pixels PX_G3 and PX_G4, and one second blue pixel PX_B2. Each of pixel areas PXA may include an emission area ELA and a non-emission area NEA. According to an embodiment of the inventive concept, the light emitting area ELA may have a rectangular shape, but the invention is not limited thereto. A second light emitting element may be disposed on the emission area ELA, and transistors for driving the second light emitting element may be disposed on the non-emission area NEA.

A plurality of second pixel groups PG2 may be disposed on the second area AA2 of the opening area DP-DA1. Like the first area AA1, the second area AA2 may be defined as a unit area. That is, the second area AA2 and the first area AA1 may have the same surface area.

Similar to the first area AA1, 18 second pixel groups PG2 may be disposed on the second area AA2. That is, the number of second pixel groups PG2 disposed on the second area AA2 may be substantially the same as the number of the first pixel groups PG1 disposed on the first area AA1. However, the embodiment of the inventive concept is not limited thereto. For example, the number of second pixel groups PG2 greater than the number of first pixel groups PG1 disposed on the first area AA1 may be disposed on the second area AA2.

Referring to FIGS. 4, 9A, 10A, and 10B, each of the second pixels may have luminance greater than luminance of each of the first pixels. That is, each of the first pixels may have first luminance, and each of the second pixels have second luminance. Here, the second luminance may be greater than the first luminance. The first pixels may be disposed on the display area DP-DA2 of the display panel DP, and the second pixels may be pixels disposed on the sub-display part SDP. In the electronic device according to an embodiment, the second luminance of each of the second pixels disposed on the sub-display part SDP, which is disposed at a lower side in the third direction DR3, may be set to be high, and the first luminance of each of the first pixels disposed on the main part DP-M, which is disposed at an upper side in the third direction DR3, may be set to be low to reduce a difference in luminance of the images displayed on the opening area DP-DA1 and the display area DP-DA2.

Figure 11A:
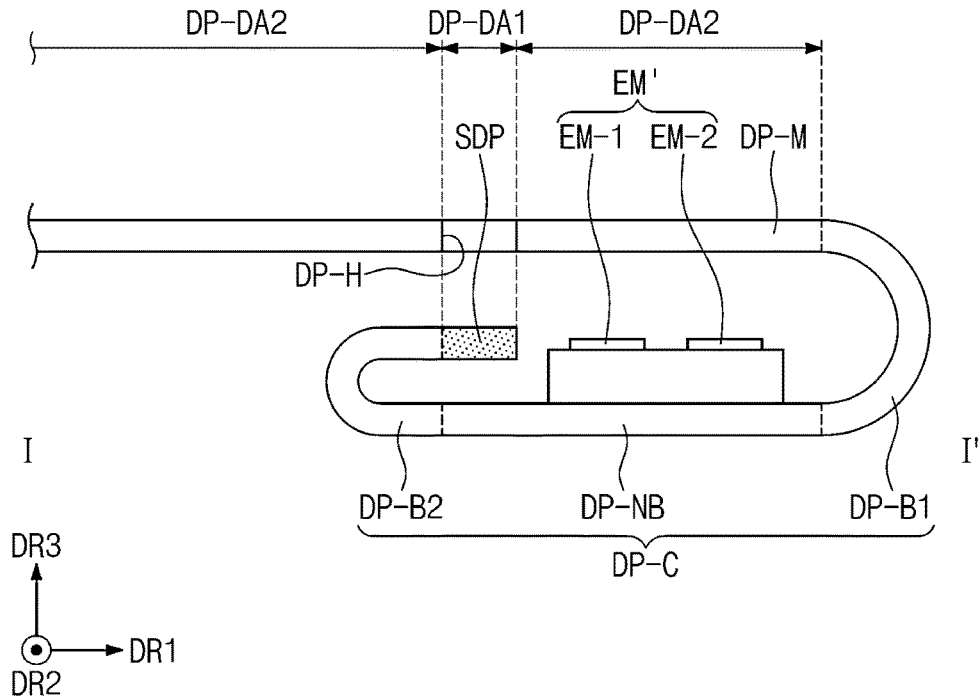
FIGS. 11A to 11C are cross-sectional views illustrating certain modes in which some constituents of the electronic device operate according to another embodiment of the inventive concept.
Figure 11B:
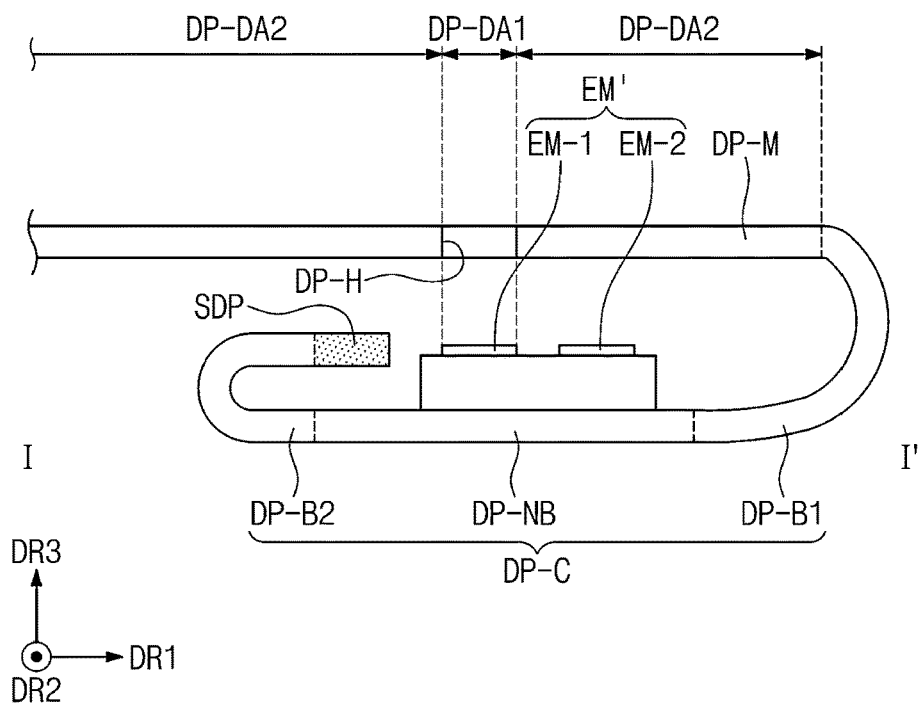
Figure 11C:
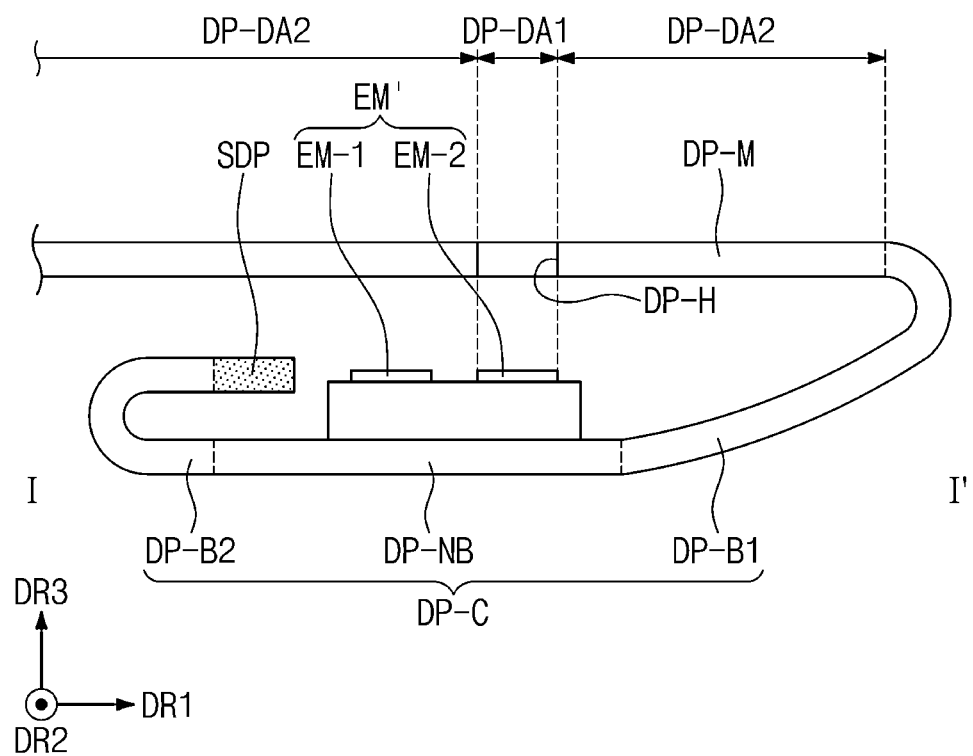

FIGS. 11A to 11C are cross-sectional views illustrating certain modes in which some constituents of the electronic device operate according to another embodiment of the inventive concept. FIGS. 11A to 11C are cross-sectional views taken along line I-I' of FIG. 2. FIG. 11A illustrates a state in which the electronic device operates in the first mode according to an embodiment of the inventive concept. FIG. 11B illustrates a state in which the electronic device operates in a first sub-mode according to an embodiment of the inventive concept. FIG. 11B illustrates a state in which the electronic device operates in a second sub-mode according to an embodiment of the inventive concept. Hereinafter, in describing the operation of the electronic device according to an embodiment of the present invention with reference to FIGS. 11A to 11C, detailed description with respect to the same contents as those described in FIGS. 7A and 7B will be omitted.

Referring to FIGS. 2 and 11A to 11C together, in the electronic device EA according to an embodiment, an electronic module EM' may include a first electronic module EM-1 and a second electronic module EM-2.

Each of the first electronic module EM-1 and the second electronic module EM-2 may be a camera module or a sensor module. For example, the first electronic module EM-1 may be the camera module, and the second electronic module EM-2 may be the sensor module. Alternatively, both the first electronic module EM-1 and the second electronic module EM-2 may be camera modules. The first electronic module EM-1 and the second electronic module EM-2 may be camera modules having different focal lengths.

The electronic device EA according to an embodiment may operate in a first mode, in which the sub-display part SDP is disposed below the opening area DP-DA1 as illustrated in FIG. 11A, a first sub-mode, in which the first electronic module EM-1 is disposed below the opening area DP-DA1 as illustrated in FIG. 11B, and a second sub-mode, in which the second electronic module EM-2 is disposed below the opening area DP-DA1 as illustrated in FIG. 11C. Although not shown, the electronic device EA according to an embodiment may further include a driving device that moves the sub-display part SDP, the first electronic module EM-1, and the second electronic module EM-2 in the first direction DR1 or the opposite direction of the first direction DR1. Each of the sub-display part SDP, the first electronic module EM-1, and the second electronic module EM-2 may be moved in the first direction DR1 or the opposite direction of the first direction by the operation of the driving device. Thus, the electronic device EA may operate in one of the first mode, the first sub-mode, and the second mode.

Figure 12:
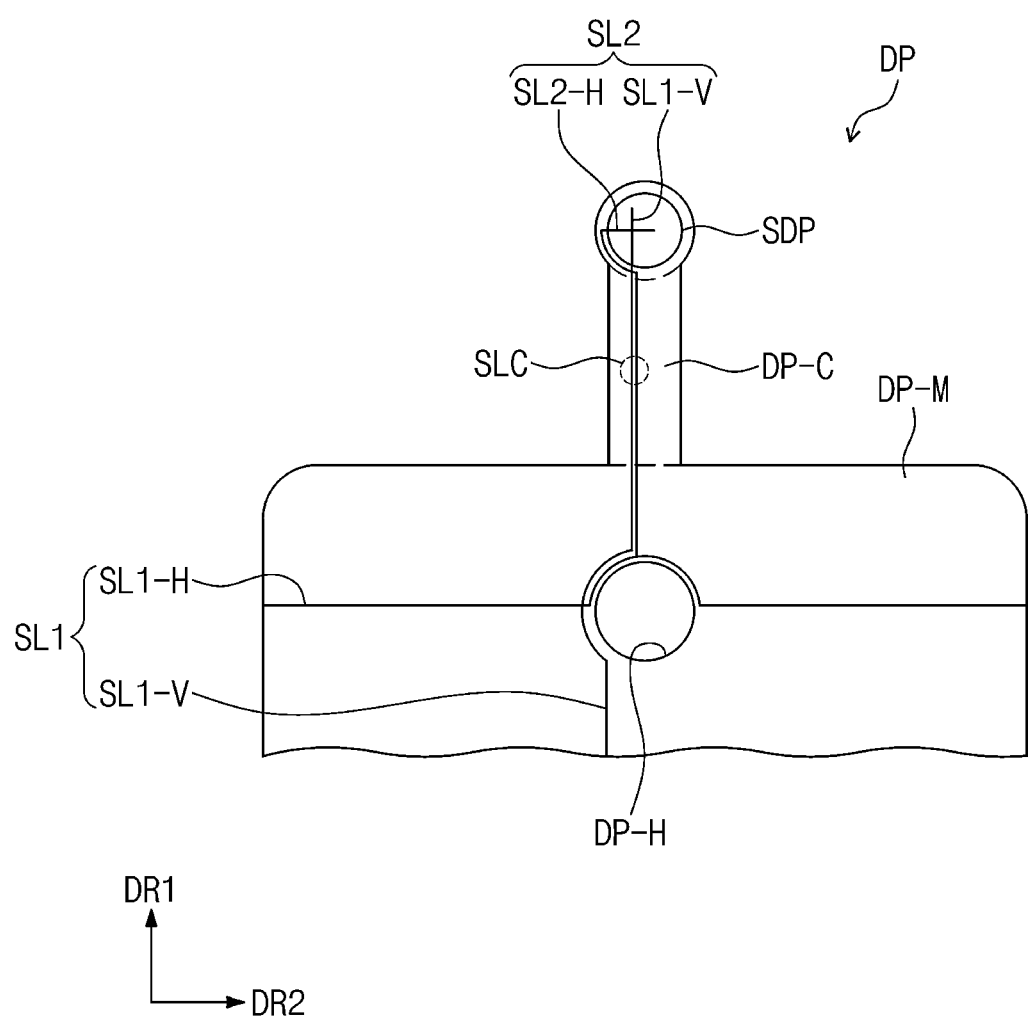
FIG. 12 is a plan view illustrating a portion of the display panel according to an embodiment of the inventive concept.

FIG. 12 is a plan view illustrating a portion of the display panel according to an embodiment of the inventive concept. In FIG. 12, a state in which the display panel DP is not bent is illustrated for convenience of description.

Referring to FIG. 12, a plurality of signal lines may be provided in the display panel DP. The main part DP-M of the display panel DP may include a first signal line SL1, and the connection part DP-C may include a second signal line SL2. The first signal line SL1 may be connected to first pixels disposed on the main part DP-M, and the second signal line SL2 may be connected to second pixels disposed on the sub-display part SDP.

The first signal line SL1 may include a first horizontal line SL1-H crossing the main part DP-M in a horizontal direction (i.e., the second direction DR2), and a first vertical line SL1-V crossing the main part DP-M in a vertical direction (i.e., the first direction DR1). A portion of the first horizontal line SL1-H and the first vertical line SL1-V may have a shape extending along at least a portion of an edge of the panel hole DP-H. The second signal line SL2 may include a second horizontal line SL2-H crossing the sub-display part SDP in the horizontal direction (i.e., the second direction DR2) and a second vertical line SL2-V (i.e., the first direction DR1) crossing the sub-display part SDP in the vertical direction.

A connection signal line SLC may be disposed on the connection part DP-C of the display panel DP. The first signal line SL1 and the second signal line SL2 may be connected to each other by the connection signal line SLC. The second horizontal line SL2-H may be connected to the first horizontal line SL1-H through the connection signal line SLC, and the second vertical line SL2-V may be connected to the first vertical line SL1-V through the connection signal line SLC. That is, the first signal line SL1 and the second signal line SL2 may be electrically connected to each other to receive the same driving signal. Particularly, the second horizontal line SL2-H may receive a signal corresponding to the first horizontal line SL1-H, and the second vertical line SL2-V may receive a signal corresponding to the first vertical line SL1-V. As the first signal line SL1 and the second signal line SL2 are electrically connected to each other, the first pixels connected to the first signal line SL1 and the second pixels connected to the second signal line SL2 may have the same driving signal. Therefore, the display panel DP may display a synchronized single image on the entire surface of the active area DP-DA.

According to the embodiment of the inventive concept, in one mode of the electronic device, since the sub-display module is disposed on the area in which the opening is defined to display the image, the single image may be displayed on the entire surface of the display area, and in the other mode of the electronic device, since the module such as the sensor, the camera, or the like is disposed on the area in which the opening is defined, the module such as the sensor, the camera, or the like may be improved in performance.

It will be apparent to those skilled in the art that various modifications and variations can be made in the inventive concept. Thus, it is intended that the present disclosure covers the modifications and variations of this invention provided they come within the scope of the appended claims and their equivalents. Therefore, the technical scope of the inventive concept is not limited to the contents described in the detailed description of the specification, but should be determined by the claims.

What is claimed is:

1. An electronic device, which operates in a first mode and a second mode, the electronic device comprising:
   a display panel comprising a main part on which an opening area and a display area surrounding the opening area are defined, and a sub-display part disposed below the main part; and
   an electronic module disposed below the display panel,
   wherein, in the first mode, the sub-display part is disposed below and overlaps the opening area in a plan view,
   in the second mode, the electronic module is disposed below and overlaps the opening area in the plan view, and
   the sub-display part and the electronic module move together in a same direction relative to the opening area in the plan view and are connected together.

2. The electronic device of claim 1, wherein the electronic module comprises a camera module or a sensor module.

3. The electronic device of claim 1, wherein the display panel further comprises a connection part extending from one side of the main part and bent so that at least a portion of the connection part has a predetermined curvature, and
   the sub-display part extends from the connection part and is disposed opposite to the main part with respect to the connection part.

4. The electronic device of claim 3, wherein the connection part comprises:
   a first bent portion extending from the main part and bent to have a first predetermined curvature; and
   a non-bent portion extending from the first bent portion and disposed below the main part,
   wherein the sub-display part is disposed between the non-bent portion and the main part in a cross-sectional view.

5. The electronic device of claim 4, wherein the electronic module is disposed between the non-bent portion and the main part in the cross-sectional view.

6. The electronic device of claim 1, further comprising a driving device which moves the sub-display part and the electronic module.

7. The electronic device of claim 6, wherein, when changing from the second mode to the first mode, the driving device moves the sub-display part in a first direction so that the sub-display part is disposed below and overlaps the opening area in the plan view in the first mode, and when changing from the first mode to the second mode, the driving device moves the electronic module in a direction opposite to the first direction so that the electronic module is disposed below and overlaps the opening area in the plan view in the second mode.

8. The electronic device of claim 6, wherein the driving device comprises:
   a first driving part which moves the sub-display part in a vertical direction; and
   a second driving which moves the electronic module in one direction crossing the vertical direction and a direction opposite to the one direction,
   wherein, when changing from the second mode to the first mode, the first driving part moves the sub-display part in an upward direction, and the second driving part moves the electronic module in the one direction, and
   when changing from the first mode to the second mode, the first driving part moves the sub-display part in a downward direction, and the second driving part moves the electronic module in a direction opposite to the one direction.

9. The electronic device of claim 1, wherein the main part displays a first image, and
   the sub-display part displays a second image synchronized with the first image.

10. The electronic device of claim 1, wherein a panel hole which overlaps the opening area in the plan view is defined in the main part.

11. The electronic device of claim 1, further comprising a window disposed on the display panel.

12. The electronic device of claim 1, wherein the display panel comprises:
   a base layer;
   a circuit layer disposed on the base layer;
   a light emitting element layer disposed on the circuit layer;
   an encapsulation layer disposed on the light emitting element layer; and
   a sensor layer disposed on the encapsulation layer.

13. The electronic device of claim 1, wherein the electronic module comprises a first electronic module and a second electronic module, and
   the second mode comprises:
   a first sub-mode in which the first electronic module is disposed below and overlaps the opening area in the plan view; and
   a second sub-mode in which the second electronic module is disposed below and overlaps the opening area in the plan view.

14. An electronic device, which operates in a first mode and a second mode, the electronic device comprising:
   a display panel comprising a main part on which an opening area and a display area surrounding the opening area are defined, and a sub-display part disposed below the main part; and
   an electronic module disposed below the display panel,
   wherein, in the first mode, the sub-display part is disposed below and overlaps the opening area in a plan view, and
   in the second mode, the electronic module is disposed below and overlaps the opening area in the plan view,
   wherein the display panel comprises:
   a plurality of first pixels disposed on the display area of the main part and which has first luminance; and
   a plurality of second pixels disposed on the sub-display part and which has second luminance,
   wherein the second luminance is greater than the first luminance.

15. The electronic device of claim 14, wherein the display panel further comprises:
   a first signal line connected to the first pixels; and
   a second signal line connected to the second pixels,
   wherein the first signal line and the second signal line are electrically connected to each other.

16. An electronic device comprising:
   a display panel on which an opening area and a display area which surrounds the opening area are defined; and
   an electronic module disposed below the display panel,
   wherein the display panel comprises:
   a main part on which the opening area and the display area are defined;
   a connection part extending from one side of the main part and bent so that at least a portion of the connection part has a predetermined curvature; and
   a sub-display part extending from the connection part, disposed opposite to the main part with respect to the connection part, and disposed below the main part,
   wherein the electronic module is disposed on the connection part.

17. The electronic device of claim 16, wherein the connection part comprises:
   a first bent portion extending from the main part and bent to have a first predetermined curvature;
   a non-bent portion extending from the first bent portion and disposed below the main part; and
   a second bent portion extending from the non-bent portion and bent to have a second predetermined curvature,
   wherein the sub-display part extends from the second bent portion.

18. The electronic device of claim 16, further comprising a driving device which moves the sub-display part and the electronic module.

19. The electronic device of claim 16, wherein the main part displays a first image, and
   the sub-display part displays a second image synchronized with the first image.

* * * * *